United States Patent
Ryu et al.

(10) Patent No.: US 11,170,868 B2
(45) Date of Patent: Nov. 9, 2021

(54) SEMICONDUCTOR MEMORY DEVICES AND MEMORY SYSTEMS

(71) Applicant: SAMSUNG ELECTRONICS CO., LTD., Suwon-si (KR)

(72) Inventors: Yesin Ryu, Seoul (KR); Sanguhn Cha, Suwon-si (KR); Sunghye Cho, Hwaseong-si (KR); Kijun Lee, Seoul (KR); Myungkyu Lee, Seoul (KR); Youngcheon Kwon, Hwaseong-si (KR); Jaeyoun Youn, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/864,787

(22) Filed: May 1, 2020

(65) Prior Publication Data

US 2021/0193245 A1 Jun. 24, 2021

(30) Foreign Application Priority Data

Dec. 24, 2019 (KR) .................. 10-2019-0173598

(51) Int. Cl.
*G11C 29/00* (2006.01)
*G11C 29/42* (2006.01)
(Continued)

(52) U.S. Cl.
CPC ............ *G11C 29/42* (2013.01); *G11C 7/1057* (2013.01); *G11C 7/1084* (2013.01); *G11C 29/14* (2013.01);
(Continued)

(58) Field of Classification Search
CPC . G11C 29/42; G11C 2029/0411; G11C 29/52; G11C 11/4093; G11C 7/1006; G11C 29/30; G11C 29/36; G11C 29/44; G11C 5/025; G11C 7/1009; G11C 11/4076; G11C 11/4096; G11C 2029/0409; G11C 2029/4402; G11C 29/02; G11C 7/1018; G11C 7/106; G11C 7/1087; G11C 2029/1202; G11C 2029/1204; G11C 29/14; G11C 7/1057; G11C 7/1084; G06F 11/1048; G06F 11/1044; G06F 11/10;
(Continued)

(56) References Cited

U.S. PATENT DOCUMENTS 5,335,234 A 8/1994 Matteson et al.
6,662,333 B1 12/2003 Zhang et al.
(Continued)

*Primary Examiner* — Thong Q Le
(74) *Attorney, Agent, or Firm* — Sughrue Mion, PLLC

(57) ABSTRACT

A semiconductor memory device includes a memory cell array and an interface circuit including an error correction code (ECC) engine. The memory cell array includes a plurality of volatile memory cells, a normal cell region and a parity cell region. The interface circuit, in a write operation, receives main data and first parity data from an external device, the first parity data being generated based on a first ECC and stores the main data in the normal cell region and the first parity data in the parity cell region. The interface circuit, in a read operation, performs an ECC decoding on the main data using a second ECC, based on the first parity data to correct a first type of error in the main data. The second ECC has a parity check matrix which is the same as a parity check matrix of the first ECC.

20 Claims, 27 Drawing Sheets

(51) Int. Cl.
  *G11C 29/14* (2006.01)
  *G11C 7/10* (2006.01)
  *G11C 29/44* (2006.01)
  *G11C 29/12* (2006.01)

(52) U.S. Cl.
  CPC ...... *G11C 29/44* (2013.01); *G11C 2029/1202* (2013.01); *G11C 2029/1204* (2013.01)

(58) Field of Classification Search
  CPC ............ G06F 11/1064; G06F 11/1068; G06F 11/108; G06F 11/1666; G06F 11/2215; G06F 2201/805; G06F 3/0604; G06F 3/0659; G06F 3/0679
  See application file for complete search history.

(56) References Cited

U.S. PATENT DOCUMENTS

| | | |
|---|---|---|
| 7,231,585 B2 | 6/2007 | Vainsencher et al. |
| 8,316,280 B2 | 11/2012 | Chang et al. |
| 8,468,416 B2 | 6/2013 | Gara et al. |
| 8,984,372 B2 | 3/2015 | Gandhi et al. |
| 10,243,588 B2 | 3/2019 | Kim |
| 2017/0344424 A1 | 11/2017 | Halbert et al. |
| 2018/0268917 A1* | 9/2018 | Lee ........................ G11C 29/42 |

* cited by examiner

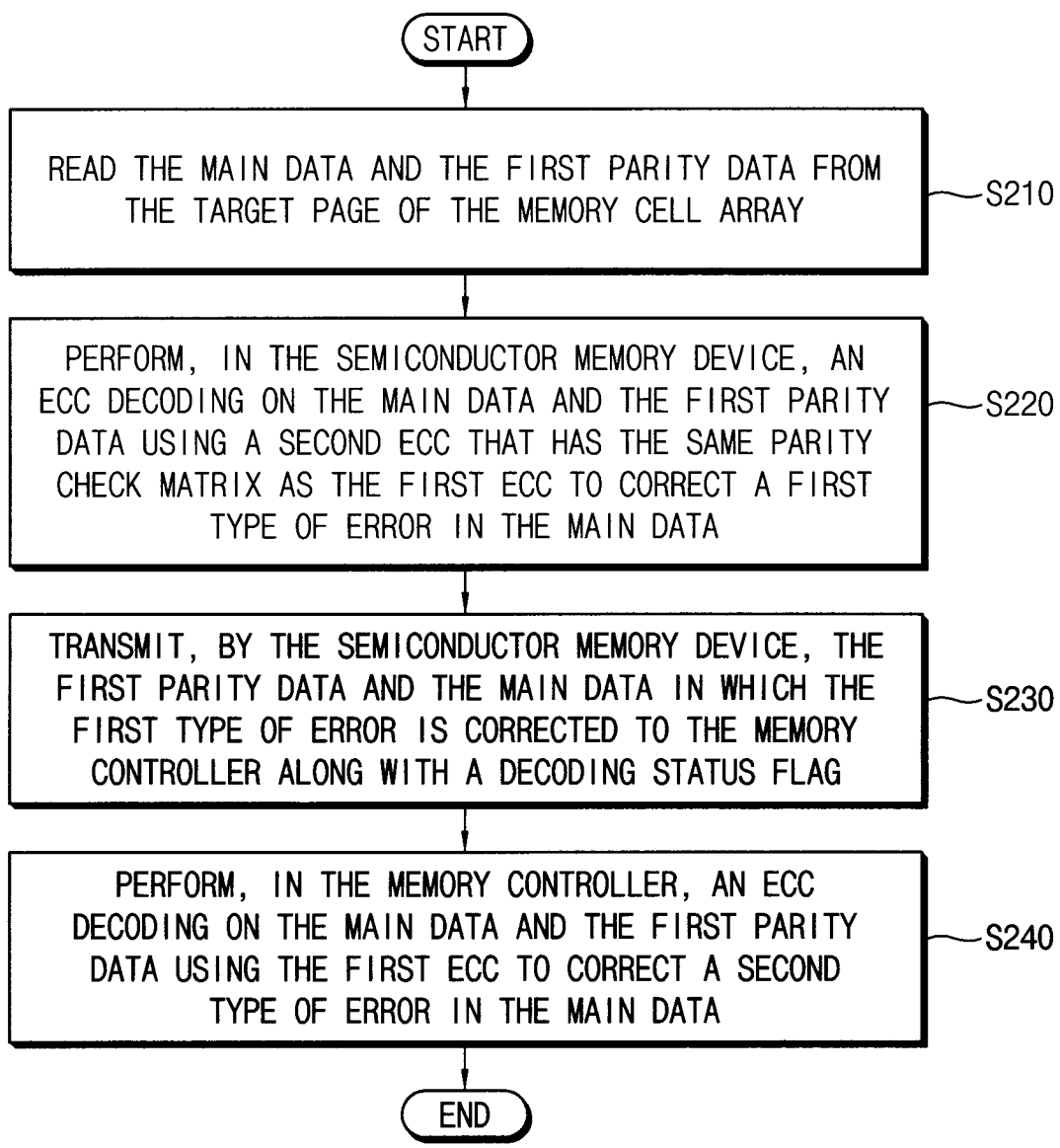

SEMICONDUCTOR MEMORY DEVICES AND MEMORY SYSTEMS

CROSS-REFERENCE TO RELATED APPLICATION

This application is based on and claims priority under 35 USC § 119 to Korean Patent Application No. 10-2019-0173598, filed on Dec. 24, 2019, in the Korean Intellectual Property Office (KIPO), the disclosure of which is incorporated in its entirety by reference herein.

BACKGROUND

1. Field

Exemplary embodiments relate to memories, and more particularly to semiconductor memory devices and memory systems.

2. Discussion of the Related Art

Recently, capacity and speed of a semiconductor memory, which may be used as a storage device in most recent memory systems, are increasing. Furthermore, various attempts are being made for mounting a memory with a larger capacity within a smaller space and efficiently operating the memory.

Recently, in order to increase the integration of a semiconductor memory, a 3-dimensional (3D) structure including a plurality of stacked memory chips is being applied instead of a 2-dimensional (2D) structure. Based on demand for large integration and large capacity memories, a structure that employs a 3D stacked structure of the memory chips for increasing the capacity of a memory, increasing integration by reducing the size of a semiconductor chip, and reducing cost for manufacturing the same has been developed.

SUMMARY

One or more exemplary embodiments provide a semiconductor memory device capable of increasing error correction capability.

One or more exemplary embodiments provide a memory system capable of increasing error correction capability.

According to an aspect of the disclosure, there is provided a semiconductor memory device comprising: a memory cell array including a plurality of volatile memory cells coupled to a plurality of word-lines and a plurality of bit-lines, the memory cell array including a normal cell region and a parity cell region; and an interface circuit including an error correction code (ECC) engine, the interface circuit configured to: in a write operation of the semiconductor memory device: receive main data and first parity data from an external device, the first parity data being generated based on a first ECC; and store the main data in the normal cell region and the first parity data in the parity cell region, in a read operation of the semiconductor memory device, perform an ECC decoding on the main data read from the normal cell region using a second ECC, based on the first parity data read from the parity cell region to correct a first type of error in the main data, wherein the second ECC has a parity check matrix which is the same as a parity check matrix of the first ECC.

According to another aspect of the disclosure, there is provided a memory system, comprising: a memory controller including a first error correction code (ECC) engine, the memory controller configured to generate first parity data based on main data by using a first ECC; and a semiconductor memory device configured to receive the main data and the first parity data from the memory controller, wherein the semiconductor memory device includes: a memory cell array including a plurality of volatile memory cells coupled to a plurality of word-lines and a plurality of bit-lines, the memory cell array including a normal cell region and a parity cell region; and an interface circuit including a second ECC engine, the interface circuit configured to: in a write operation of the semiconductor memory device, store the main data in the normal cell region and the first parity data in the parity cell region, in a read operation of the semiconductor memory device, perform an ECC decoding on the main data read from the normal cell region using a second ECC, based on the first parity data read from the parity cell region to correct a first type of error in the main data, wherein the second ECC has a parity check matrix which is the same as a parity check matrix of the first ECC, wherein the first ECC engine is configured to receive the main data from the semiconductor memory device and is configured to correct a second type of error in the main data using the first ECC, and wherein the second type is different from the first type.

According to another aspect of the disclosure, there is provided a memory system, comprising: a memory controller including a first error correction code (ECC) engine having a first ECC decoder which uses a first ECC, the memory controller configured to output main data; and a semiconductor memory device configured to receive the main data from the memory controller, wherein the semiconductor memory device includes: a memory cell array including a plurality of volatile memory cells coupled to a plurality of word-lines and a plurality of bit-lines, the memory cell array including a normal cell region and a parity cell region; and an interface circuit including a second ECC engine having a second ECC decoder, the interface circuit configured to: in a write operation of the semiconductor memory device, perform an ECC decoding on the main data using a second ECC to generate first parity data, and store the main data in the normal cell region and the first parity data in the parity cell region, and in a read operation of the semiconductor memory device, perform an ECC decoding on the main data read from the normal cell region using the second ECC, based on the first parity data read from the parity cell region to correct a multi-bit error of one of symbols of the main data, and transmit, to the memory controller, a decoding status flag associated with the multi-bit error, wherein the second ECC has a parity check matrix which is the same as a parity check matrix of the first ECC.

According to another aspect of the disclosure, there is provided a memory system, comprising: a memory controller including a first error correction code (ECC) engine and a central processing unit (CPU) configured to control the first ECC engine, wherein the first ECC engine is configured to generate first parity data using the main data and a first ECC; and a semiconductor memory device configured to receive the main data and the first parity data from the memory controller, wherein the semiconductor memory device includes: a memory cell array including a plurality of volatile memory cells coupled to a plurality of word-lines and a plurality of bit-lines, the memory cell array including a normal cell region and a parity cell region; and an interface circuit including a second ECC engine, the interface circuit configured to: in a write operation of the semiconductor memory device, store the main data in the normal cell region and the first parity data in the parity cell region, in a read operation of the semiconductor memory device perform an ECC decoding on the main data read from the normal cell region using a second ECC, based on the first parity data read from the parity cell region to correct a first type of error in the main data, wherein the second ECC has a parity check matrix which is the same as a parity check matrix of the first ECC.

BRIEF DESCRIPTION OF THE DRAWINGS

Illustrative, non-limiting exemplary embodiments will be more clearly understood from the following detailed description in conjunction with the accompanying drawings.

FIGS. 13A and 13B illustrate the first through eighth code groups in FIG. 12 according to exemplary embodiments.

FIG. 20B is a flow chart illustrating a read operation of the memory system according to exemplary embodiments.

DETAILED DESCRIPTION OF THE EMBODIMENTS

Exemplary embodiments will be described more fully hereinafter with reference to the accompanying drawings.

Figure 1:
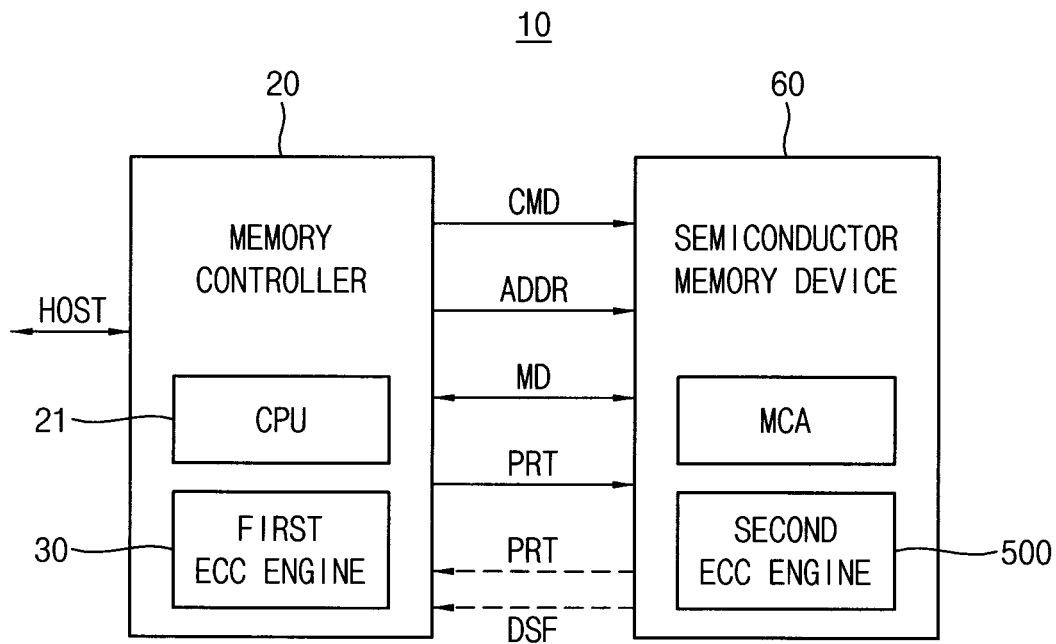
FIG. 1 is a block diagram illustrating a memory system according to exemplary embodiments.

FIG. 1 is a block diagram illustrating a memory system according to exemplary embodiments.

Referring to FIG. 1, a memory system 10 includes a memory controller 20 and a semiconductor memory device 60. The memory controller 20 may include a central processing unit (CPU) 21 and a first error correction code (ECC) engine 30. According to an embodiment, the memory controller 20 may provide a command (signal) CMD, and an address (signal) ADDR to the semiconductor memory device 60, and may exchange main data MD with the semiconductor memory device 60. In addition, the memory controller 20 may provide a parity data PRT to the semiconductor memory device 60 or may receive the parity data PRT from the semiconductor memory device 60. The first ECC engine 30 may generate the parity data PRT based on the main data MD using a first ECC.

The memory controller 20 may access the semiconductor memory device 60 based on a request from an external host. The memory controller 20 may communicate with the host through various protocols.

The semiconductor memory device 60 may include a memory cell array MCA and a second ECC engine 500. The memory cell array MCA may include a plurality of volatile memory cells coupled to a plurality of word-lines and a plurality of bit-lines.

The second ECC engine 500, in a write operation of the semiconductor memory device 60, may store the main data MD and the parity data PRT in a target page of the memory cell array MCA. The second ECC engine 500, in a read operation of the semiconductor memory device 60, may read the main data MD and the parity data PRT from the target page of the memory cell array MCA, may perform an ECC decoding on the main data MD and the parity data PRT using a second ECC to correct a single bit error of the main data MD or correct multi-bit error of one of the symbols of the main data MD and may transmit a corrected main data to the memory controller 20. In addition, the second ECC engine 500 may transmit, to the memory controller 20, a decoding status flag DSF indicating a type of the corrected error. The corrected error corresponds to an error which is generated while the corrected main data is transmitted to the memory controller 20 from the semiconductor memory device 60.

In the memory system 10 of FIG. 1, the memory controller 20 and the semiconductor memory device 60 share a same ECC (i.e., share a same parity check matrix) and may share the parity data, the semiconductor memory device 60 may correct a first type of error in the main data MD and the memory controller 20 may correct a second type of error in the main data MD. The second type is different from the first type. Accordingly, the memory system 10 may increase error correction capability.

The memory controller 20 may correct multi-bit error of one of a plurality of symbols of the corrected main data in which the single bit error is corrected by performing an ECC decoding on the corrected main data using the first ECC or may correct a transmission error of one of the symbols of the corrected main data in which the single bit error is corrected by performing an ECC decoding on the corrected main data using the first ECC. For instance, according to an embodiment, the first ECC engine 30 may correct multi-bit error of one of a plurality of symbols of the corrected main data.

Figure 2:
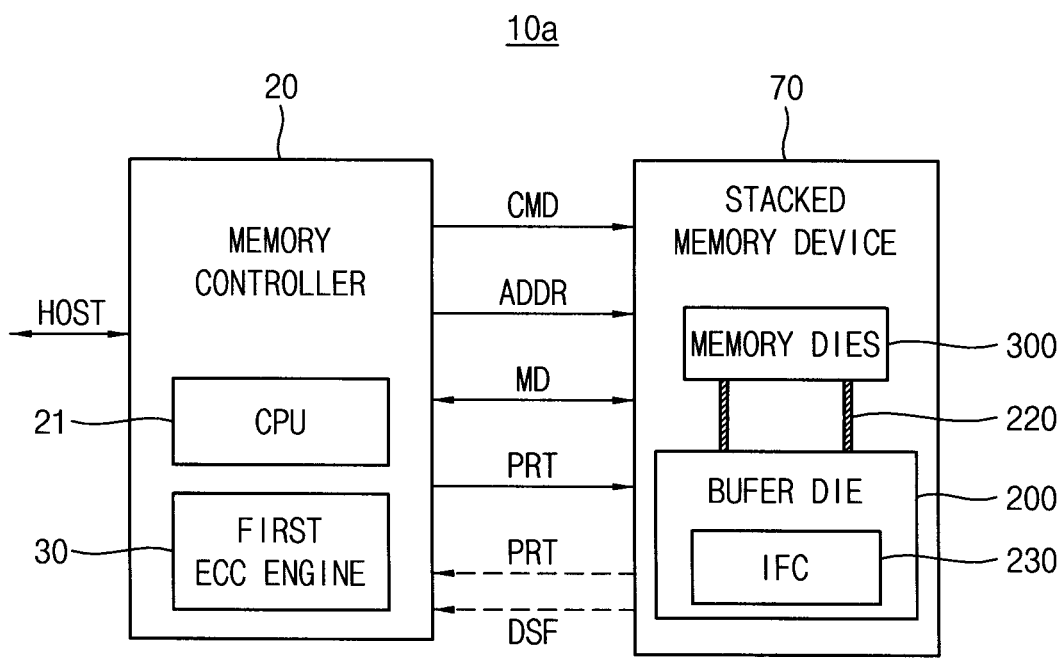
FIG. 2 is a block diagram illustrating a memory system according to exemplary embodiments.

FIG. 2 is a block diagram illustrating a memory system according to exemplary embodiments.

Referring to FIG. 2, a memory system 10 includes a memory controller 20 and a semiconductor memory device 70. The semiconductor memory device 70 may include a stacked memory device and may be referred to as a stacked memory device. Description on the memory controller 20 is the same as the description with reference to FIG. 1, and thus, description on the memory controller 20 will be omitted.

The stacked memory device 70 may include a buffer die 200 and a plurality of memory dies 300 stacked on the buffer die 200. The buffer die 200 and the memory dies 300 may be sequentially stacked on each other. The memory dies 300 stacked on the buffer die 200 may be electrically connected to the buffer die 200 through a conductor. The conductor may be one or more through silicon vias (TSVs) 220.

The buffer die 200 may communicate with the memory controller 20 and each of the memory dies 300 may be a dynamic random access memory (DRAM) device including a plurality of dynamic memory cells, such as Double Data Rate (DDR) Synchronous Dynamic Random Access Memory (SDRAM). Each of the memory dies 300 may include a memory cell array, and the memory cell array may include a normal cell region and a parity cell region.

The buffer die 200 may include an interface circuit (IFC) 230. The interface circuit 230, in a write operation of the stacked memory 70, may receive the main data MD and the parity data PRT from the memory controller 20, may store the main data MD and the parity data PRT in the normal cell region and the parity cell region of one of the memory dies 300, respectively. According to an embodiment, the memory controller 20 may be an external device. The interface circuit 230, in a read operation of the stacked memory device 70, may read the main data MD and the parity data PRT from the normal cell region and the parity cell region, may perform an ECC decoding on the main data MD based on the parity data PRT using a second ECC, and may correct a first type of error of the main data MD. The second ECC has a parity check matrix which is the same as a parity check matrix of the first ECC. In addition, the interface circuit 230 may transmit, to the memory controller 20, the decoding status flag DSF indicating the first type of error that is corrected.

Figure 3:
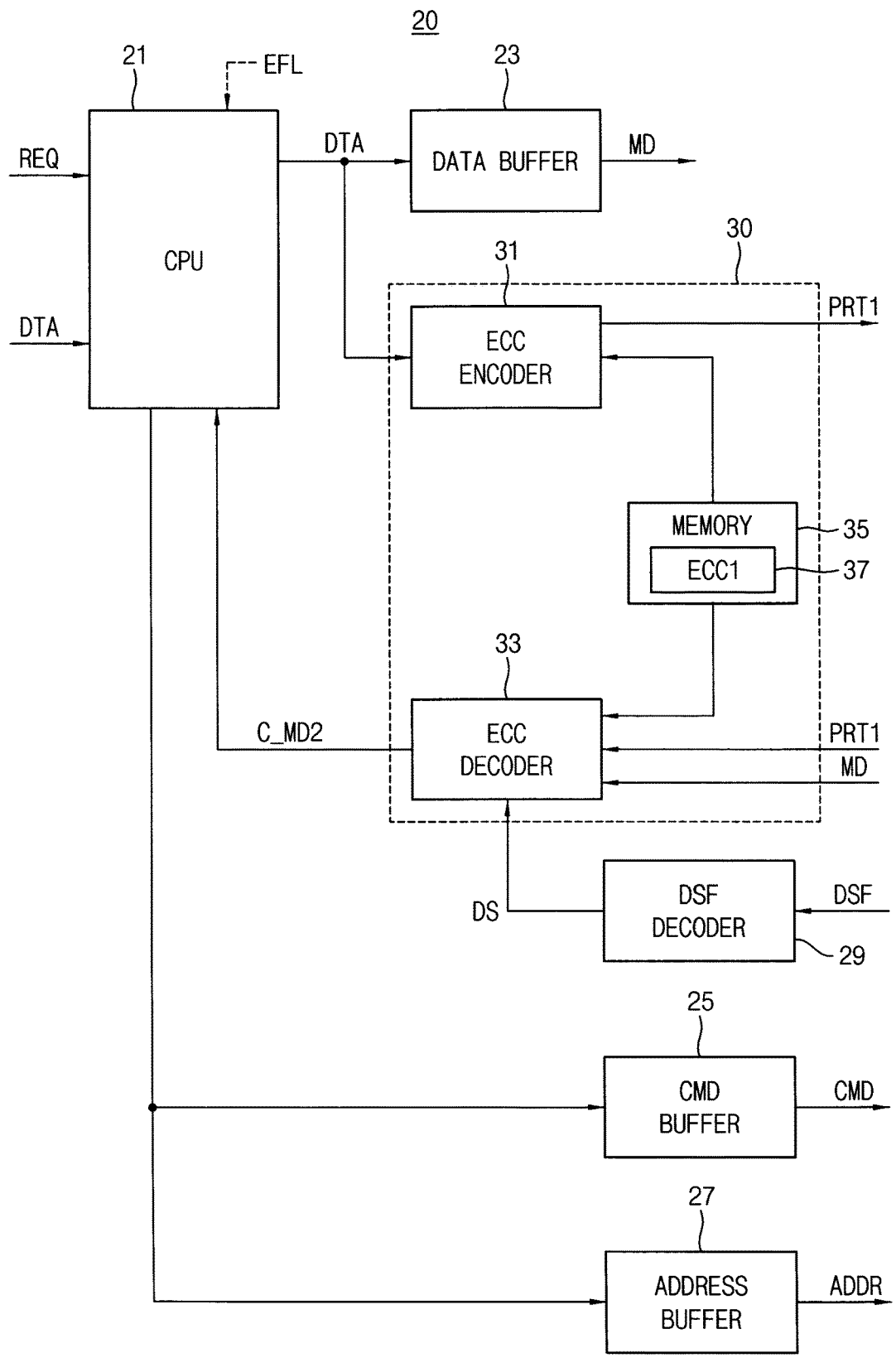
FIG. 3 is a block diagram illustrating an example of the memory controller in FIG. 2 according to exemplary embodiments.

FIG. 3 is a block diagram illustrating an example of the memory controller in FIG. 2 according to exemplary embodiments.

Referring to FIG. 3, the memory controller 20 may include the CPU 21, a data buffer 23, the first ECC engine 30, a decoding status flag decoder 29, a command buffer 25 and an address buffer 27. The first ECC engine 30 may include an ECC encoder 31, an ECC decoder 33 and a memory 35 that stores a first ECC 37. The ECC encoder 31 and the ECC decoder 33 are connected to the memory 35.

The CPU 21 receives a request REQ and data DTA from the host, and provides the data DTA to the data buffer 23 and the ECC encoder 31. The ECC encoder 31 performs an ECC encoding on the data DTA using the first ECC 37 to generate a first parity data PRT1 and provides the first parity data PRT1 to the stacked memory device 70.

The ECC decoder 33, in a read operation, receives the main data MD and the first parity data PRT1 from the stacked memory device 70, performs an ECC decoding on the main data MD based on the first parity data PRT1 using the first ECC 37 to correct a second type of error in the main data MD.

The command buffer 25 stores the command CMD corresponding to the request REQ and transmits the command CMD to the stacked memory device 70 under control of the CPU 21. The address buffer 27 stores the address ADDR and transmits the address ADDR to the stacked memory device 70 under control of the CPU 21.

The CPU 21 may control the data buffer 23 and the first ECC engine 30 to re-transmit the main data MD and the first parity data PRT1 to the stacked memory device 70 in response to receiving an error flag EFL.

The decoding status flag decoder 29 receives the decoding status flag DSF and decodes the decoding status flag DSF to provide a decoding signal DS to the ECC decoder 33. The ECC decoder 33 determines a position of corrected error and/or error in the main data MD based on the decoding signal DS and corrects the second type of error in the main data MD to provide corrected data C_MD2 to the CPU 21.

Figure 4:
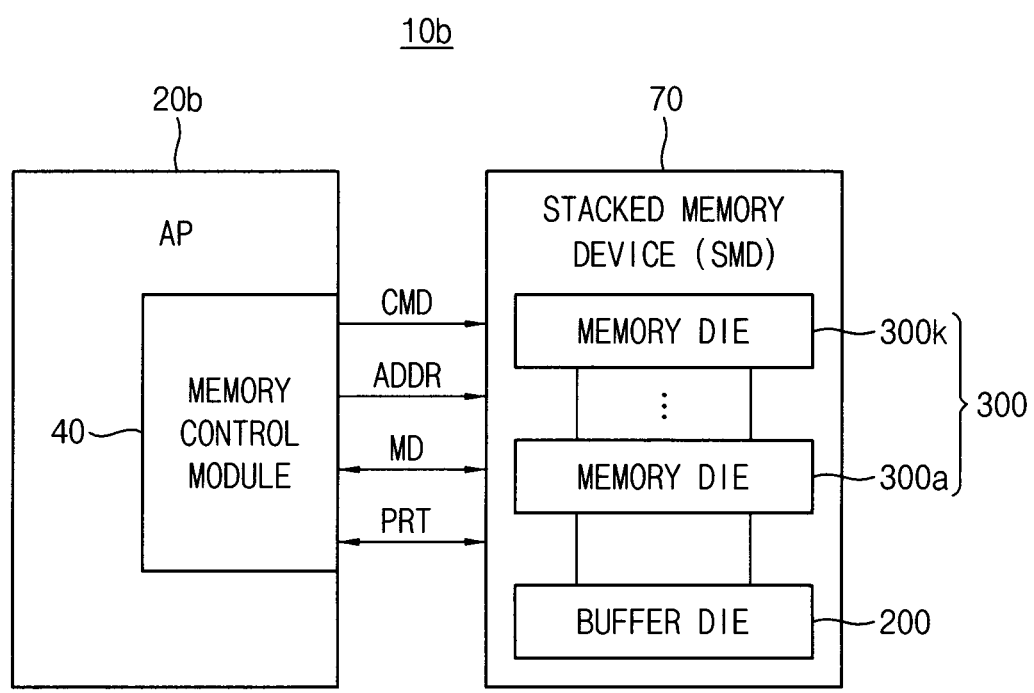
FIG. 4 is a block diagram illustrating a data processing system according to example embodiments.

FIG. 4 is a block diagram illustrating a data processing system according to example embodiments.

Referring to FIG. 4, a data processing system 10b may include an application processor 20b and a stacked memory device 70. According to an example embodiment, the data processing system 10b may be a memory system. The application processor 20b may include a memory control module 40 and the memory control module 40 included in application processor 20b and the stacked memory device 70 may constitute a memory system. According to an example embodiment, the memory control module 40 may be a graphic processing unit (GPU). The stacked memory device 70 include a buffer die 200 and memory devices 300 and the memory dies 300 include a plurality memory dies 300a~300k which are stacked on top of another memory die.

The application processor 20b may perform a function of the host. Further, the application processor 20b may be implemented as a system on chip (SoC). The SoC may include a system bus to which a protocol having a predetermined standard bus specification is applied, and may include various types of intellectual property (IP) cores connected to the system bus.

The memory control module 40 may perform a function of the memory controller 20 in FIG. 2.

In exemplary embodiments, the application processor 20b may include a graphic processing unit (GPU) instead of the memory control module 40 and the GPU may perform a function of the memory controller 20 in FIG. 2. The GPU may store, in the stacked memory device 70, data which is generated during graphic processing.

Figure 5:
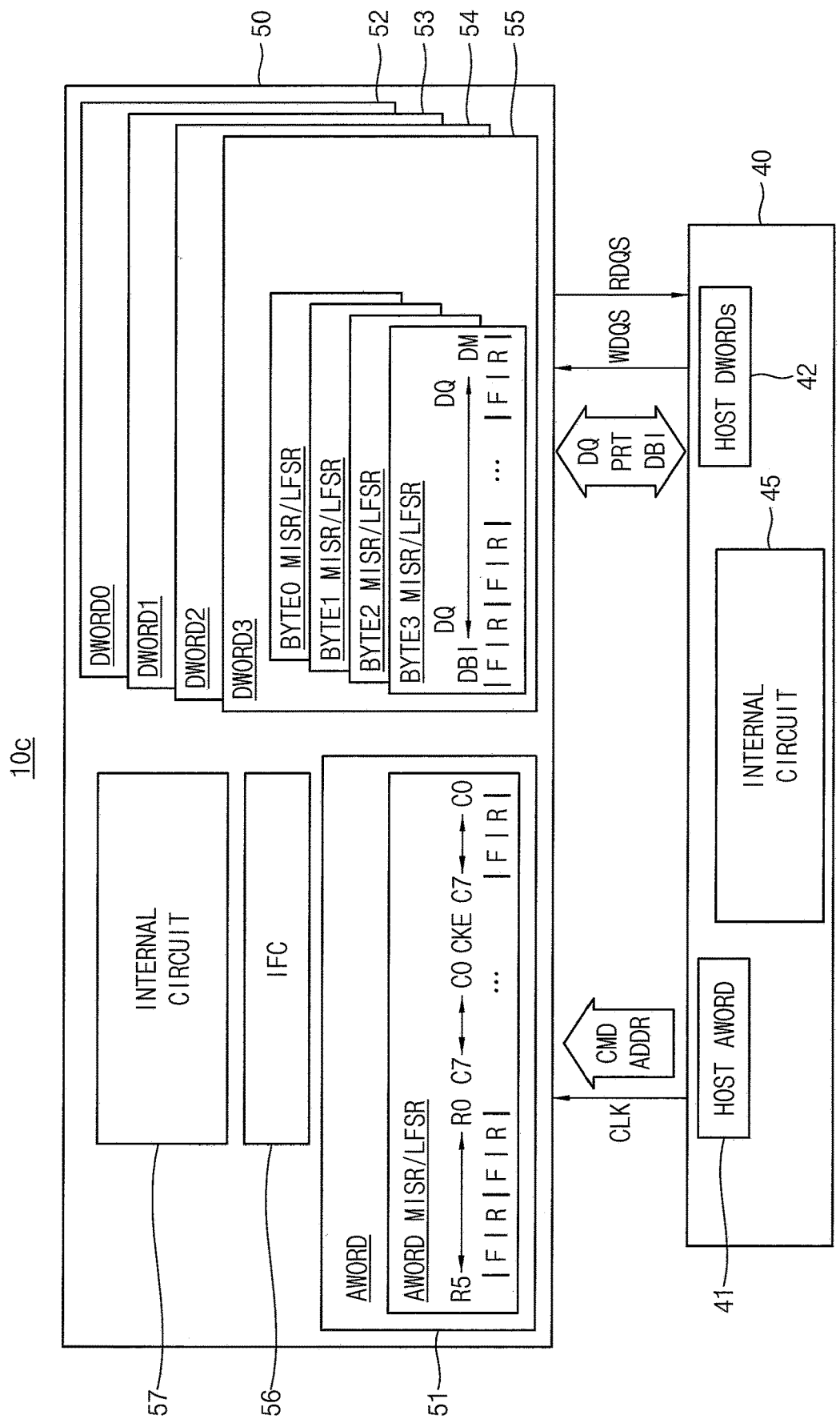
FIG. 5 illustrates a diagram illustrating a memory system according to exemplary embodiments.

FIG. 5 illustrates a diagram illustrating a memory system according to exemplary embodiments.

Referring to FIG. 5, a memory system 10c may include a memory controller 40 and a semiconductor memory device 50. The semiconductor memory device 50 may include a command-address input-output block AWORD 51, data input-output blocks DWORD0~DWORD3 52~55, an interface circuit 56 and an internal circuit 57. The memory controller 40 may include a command-address input-output block HOST AWORD 41, data input-output blocks HOST DWORDs 42 and an internal circuit 45. For example, the semiconductor memory device 50 may be compatible with high bandwidth memory (HBM) specifications.

According to an example embodiment, a command CMD, an address ADDR, a system clock signal CLK, a clock enable signal CKE, etc. may be transferred or transmitted from the command-address input-output block 41 of the memory controller 40 to the command-address input-output block 51 of the semiconductor memory device 50. Data DQ, a data bus inversion signal DBI, a parity data PRT, a write data strobe signal WDQS, a read data strobe signal RDQS, etc. may be transferred or transmitted between the data input-output blocks 42 of the memory controller 40 and the data input-output blocks 52~55 of the semiconductor memory device 50. According to an example embodiment, sub data SDT may include an external parity or a data mask signal.

The multiple-input shift register (MISR) and/or the linear feedback shift register (LFSR) may be implemented in the input-output blocks 51~55 of the semiconductor memory device 50. Using the MISR/LFSR circuits, the links between the memory controller 40 and the semiconductor memory device 50 may be tested and trained.

For example, as illustrated in FIG. 5, the MISR/LFSR circuit corresponding to one byte included in the data input-output blocks 52~55 may have a size of 20 bits. The 20 bits may include rising bits R and falling bits F of the byte data signal, the data bus inversion signal DBI and the data mask signal DM. The MISR/LFSR circuit of the command address input-output block 51 may have a size of 30 bits. The 30 bits may include rising bits R and falling bits F of the row command bits R0~R5, the column command bits C0~C7 and the clock enable signal CKE.

For example, one channel includes four data input-output blocks 52~55 corresponding to four words, and each of the four data input-output blocks 52~55 may include four MISR/LFSR circuits corresponding to four bytes BYTE0~BYTE3.

The interface circuit 56 may correspond to the interface circuit 230 in FIG. 2 and the internal circuit 57 may include a memory cell array and a peripheral circuit.

Figure 6:
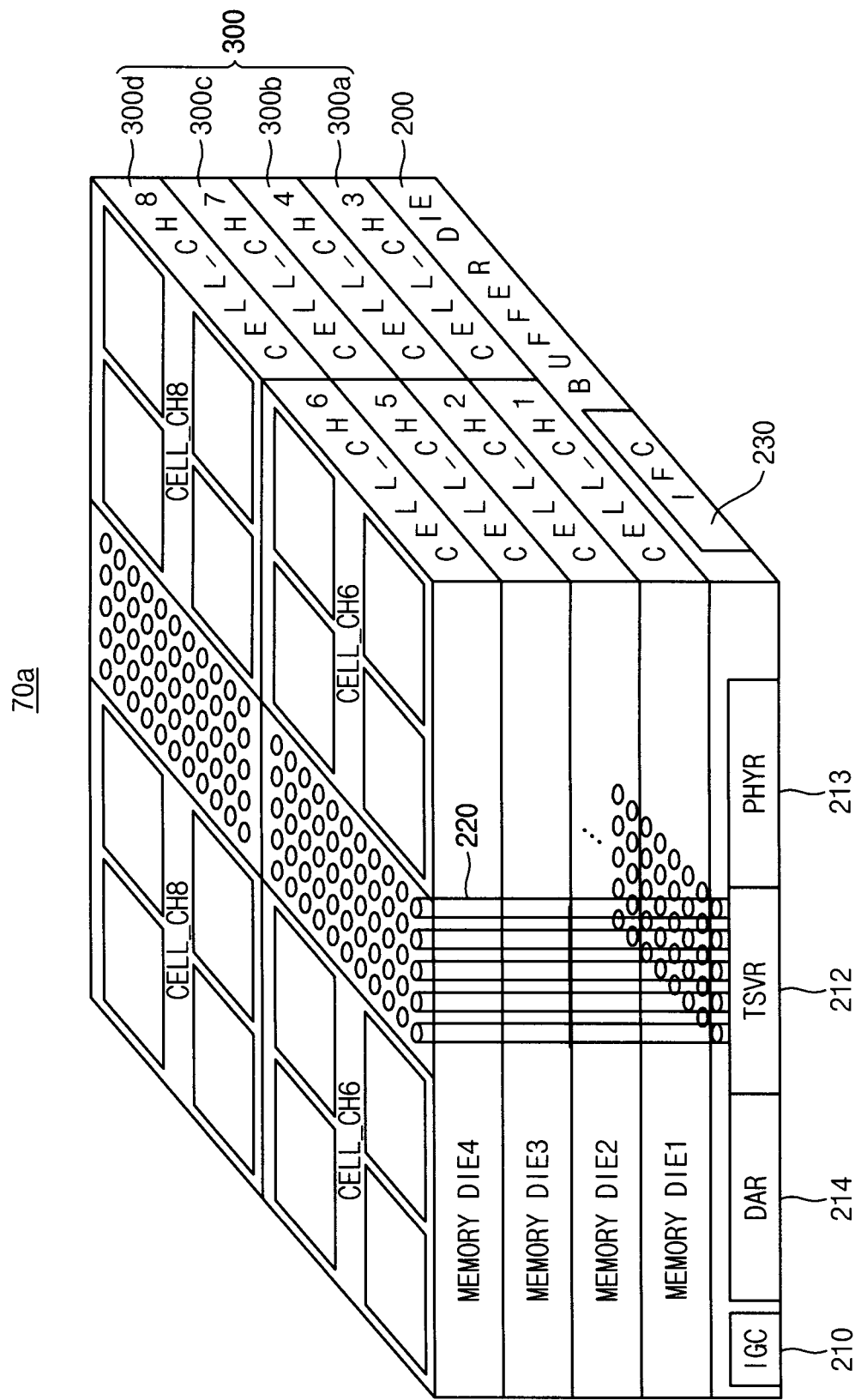
FIG. 6 is a block diagram illustrating an example of the stacked memory device in FIG. 2 according to exemplary embodiments.

FIG. 6 is a block diagram illustrating an example of the stacked memory device in FIG. 2 according to exemplary embodiments.

In FIG. 6, a memory device in a high bandwidth memory (HBM) form having an increased bandwidth by including a plurality of independent channels having independent interfaces is illustrated. A stacked memory device 70a may include a plurality of layers. For example, the stacked memory device 70a may include the buffer die 200 and one or more memory dies 300 which are stacked on buffer die 200. In the example of FIG. 6, although first to fourth memory dies 300a-300d are illustrated as being provided, the number of the core dies may be variously changed.

Further, each of the memory dies 300 may include one or more channels. According to an exemplary embodiment, a single memory die includes two channels in the example of FIG. 6, and thus an example in which the stacked memory device 70a has eight channels CH1 to CH8 is illustrated. However, the number of channel is not limited thereto.

For example, a first memory die 300a may include a first channel CH1 and a third channel CH3, a second memory die 300b may include a second channel CH2 and a fourth channel CH4, a third memory die 300c may include a fifth memory channel CH5 and a seventh channel CH7, and a fourth memory die 300d may include a sixth channel CH6 and an eighth channel CH8.

The buffer die 200 may communicate with the memory controller, receive a command, an address, and data from the memory controller, and provide the received command, address, and data to the memory dies 300. The memory controller may be an external device. The buffer die 200 may communicate with the memory controller through a conductor such as bumps and the like which are formed on an outer surface thereof. The buffer die 200 may buffer the command, the address, and the data, and thus the memory controller may interface with the memory dies 300 by driving only a load of the buffer die 200.

Further, the stacked memory device 70a may include a plurality of TSVs 220 passing through the layers.

The TSVs 220 may be disposed corresponding to the plurality of channels CH1 to CH8, may be disposed to pass through the first to fourth memory dies 300a to 300d, and each of the first to fourth memory dies 300a to 300d may include a transmitter/a receiver connected to the TSVs 220. When a normal operation in which the inputting and outputting of the data is independently performed for each channel, only the transmitter/receiver of any one core die may be enabled, with respect to each of the TSVs 220, and thus each of the TSVs 220 may independently deliver only the data of any one memory die, or any channel, as an independent channel for that one memory die or channel.

The buffer die 200 may include an internal command generator 210, the interface circuit 230, a TSV region TSVR 212, a physical region PHYR 213 and a direct access region DAR 214. The internal command generator 210 may generate an internal command based on the command CMD The TSV region 212 is a region in which TSVs 220 for communicating with the memory dies 300 are formed. Further, the physical region 213 is a region including a plurality of input-and-output (IO) circuits for communicating with an external memory controller, and various types of signals from the memory controller may be provided to the TSV region 212 through the physical region 213 and to the memory dies 300 through the TSVs 220.

The direct access region 214 may directly communicate with an external test device in a test mode for the stacked memory device 70a through a conductor which is disposed on an outer surface of the stacked memory device 70a. Various types of signals provided from the tester may be provided to the memory dies 300 through the direct access region 214 and the TSV region 212. The interface circuit 230 may perform the above-mentioned operation.

Figure 7:
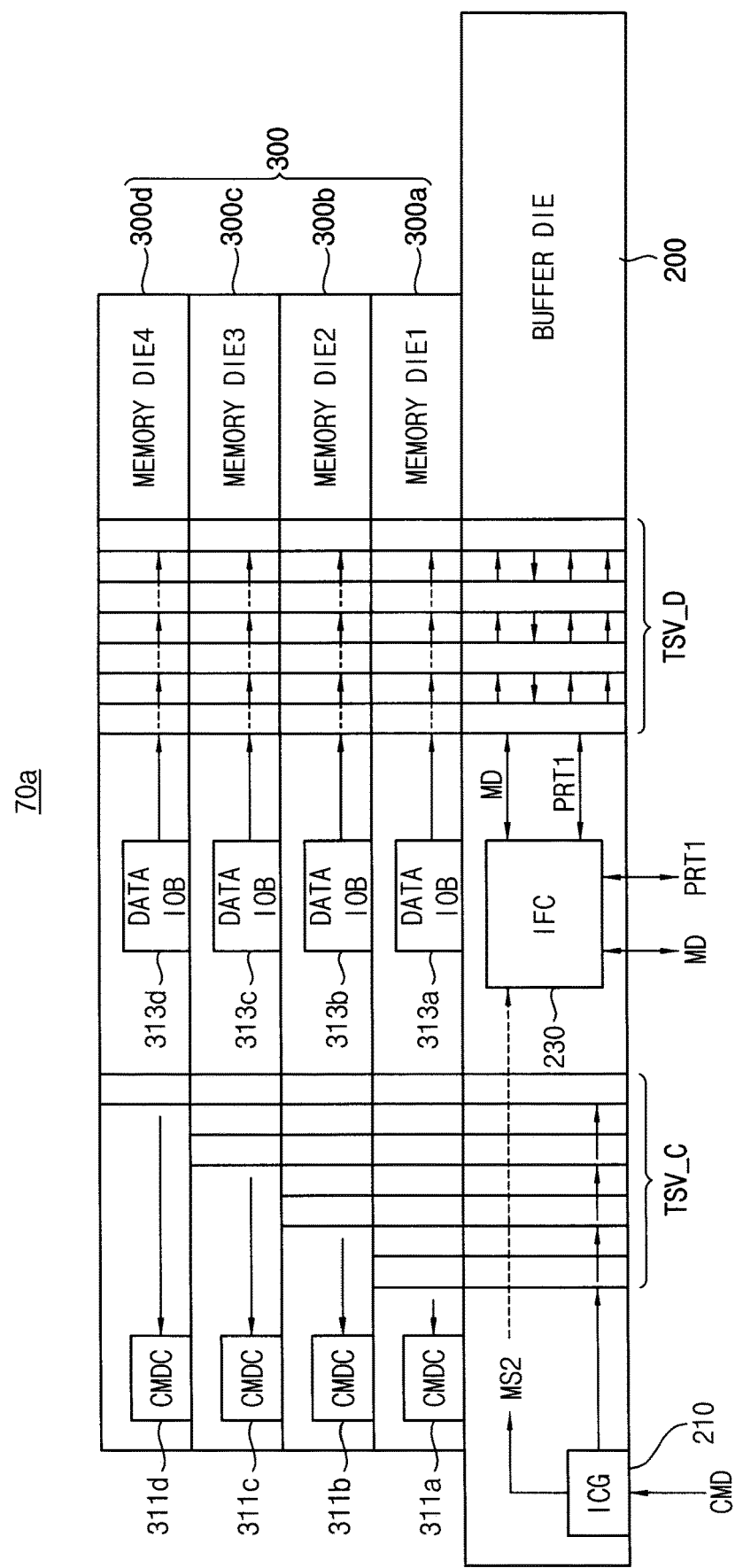
FIG. 7 illustrates operation of the interface circuit in the stacked memory device of FIG. 6.

FIG. 7 illustrates operation of the interface circuit 230 in the stacked memory device of FIG. 6 according to exemplary embodiments.

Referring to FIGS. 6 and 7, the buffer die 200 includes the internal command generator 210 and the interface circuit 230, and internal commands from the internal command generator 210 are provided to the memory dies 300 through command TSVs TSV_C which are independently formed for each channel. The internal command generator 210 may provide the interface circuit 230 with a mode signal MS designating one of a plurality of operation modes based on the command CMD.

The interface circuit 230 may provide the main data MD and the first parity data PRT1 to a corresponding memory die through data TSVs TSV_D which are commonly formed for each channel in a first mode of the write operation in response to the mode signal MS.

The interface circuit 230 may selectively perform an ECC decoding on the main data MD using the second ECC to generate a second parity data, may compare the first parity data PRT1 and the second parity data and may transmit, to the memory controller 20, an error flag indicating that the first parity data PRT1 does not match the second parity data based on a result of the comparison, in a second mode of the write operation in response to the mode signal MS. The memory controller 20 may re-transmit the main data MD and the first parity data PRT1 to the stacked memory device 70a in response to the error flag.

The memory dies 300 may respectively include command decoders 311a to 311d which output internal control signals by decoding internal commands, and data input/output (I/O) buffer 313a to 313d which perform processing operation on read data or data to be written.

Referring to one of the memory dies 300 (for example, the first memory die 300a), the first memory die 300a may perform a memory operation according to a decoding result of command decoder 311a, and for example, data of a plurality of bits stored in a memory cell region inside the first memory die 300a may be read and provided to the data I/O buffer 313a. The data I/O buffer 313a may process the data of the plurality of bits in parallel, and output the data processed in parallel to a plurality of data TSVs TSV_D in parallel.

Figure 8:
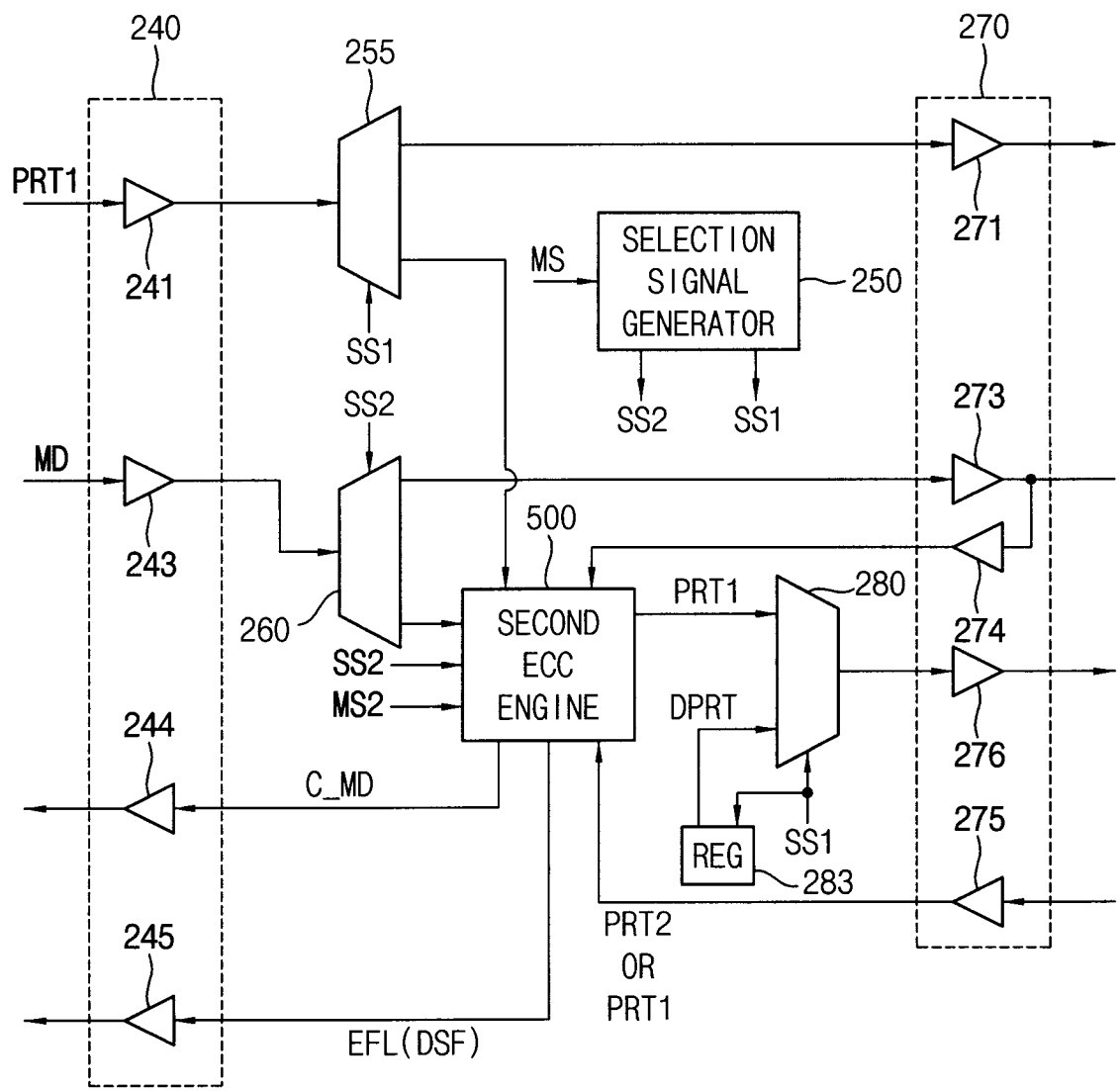
FIG. 8 is a block diagram illustrating an example of the interface circuit in FIG. 7 according to exemplary embodiments.

FIG. 8 is a block diagram illustrating an example of the interface circuit in FIG. 7 according to exemplary embodiments.

Referring to FIG. 8, the interface circuit 230 may include a first path control circuit 240, a selection circuit 255, a second path control circuit 270, a selection signal generator 250, a selection circuit 260, a second ECC engine 500, a selection circuit 280 and a register 283.

The first path control circuit 240 includes buffers 241, 243, 244 and 245. The second path control circuit 270 includes buffers 271, 273, 274, 275 and 276.

The buffer 241 provides the first parity data PRT1 to the selection circuit 255. The selection circuit 255, in response to a first selection signal SS1, provides the first parity data PRT1 to a target page through the buffer 271 or provides the first parity data PRT1 to the second ECC engine 500. The buffer 243 provides the main data MD to the selection circuit 260. The selection circuit 260, in response to a second selection signal SS2, provides the main data MD to the target page through the buffer 273 or provides the main data MD to the second ECC engine 500.

The selection signal generator 250 generate the first selection signal SS1 and the second selection signal SS2 in response to the mode signal MS.

The buffer 274 receives the main data MD from the target page and provides the main data MD to the second ECC engine 500, and the buffer 275 receives the first parity data PRT1 or the second parity data PRT2 from the target page and provides the first parity data PRT1 or the second parity data PRT2 to the second ECC engine 500. The selection circuit 280, in response to the first selection signal SS1, provides one of the first parity data PRT1 and a default parity data DPRT to the target page through the buffer 276. The register 286 stores the default parity data DPRT and provides the default parity data DPRT to the selection circuit 280 in response to the first selection signal SS1.

The second ECC engine 500, in a second mode of the write operation in response to the mode signal MS, may generate the second parity data PRT2 based on the main data MD, may compare the first parity data PRT1 and the second parity data PRT2, and may provide the memory controller 20 through the buffer 245 with the error flag EFL indicating that the second parity data PRT2 does not match the first parity data PRT based on the comparison. The second ECC engine 500, in a third mode of the write operation in response to the mode signal MS, may generate the second parity data PRT2 based on the main data MD, and may provide the second parity data PRT2 to the target page through the selection circuit 280 and the buffer 276. The second ECC engine 500, in a first mode of the write operation in response to the mode signal MS, may not generate the second parity data PRT2.

The second ECC engine 500, in a first mode of the read operation in response to the mode signal MS, may perform an ECC decoding on the main data MD provided from the buffer 274 based on the first parity data PRT1 by using the second ECC to correct a single bit error in the main data MD and may provide the corrected main data C_MD to the memory controller 20 through the buffer 244.

The second ECC engine 500, in a second mode of the read operation in response to the mode signal MS, may perform an ECC decoding on the main data MD provided from the buffer 274 based on the first parity data PRT1 by using the second ECC to correct a multi-bit error in one of the symbols of the main data MD and may provide the corrected main data C_MD to the memory controller 20 through the buffer 244.

The second ECC engine 500, in a third mode of the read operation in response to the mode signal MS, may perform an ECC decoding on the main data MD provided from the buffer 274 based on the second parity data PRT2 by using the second ECC to correct a multi-bit error in one of the symbols of the main data MD, may provide the corrected main data C_MD to the memory controller 20 through the buffer 244, and may provide the decoding status flag DSF associated with the multi-bit error to the memory controller 20 through the buffer 245.

Figure 9:
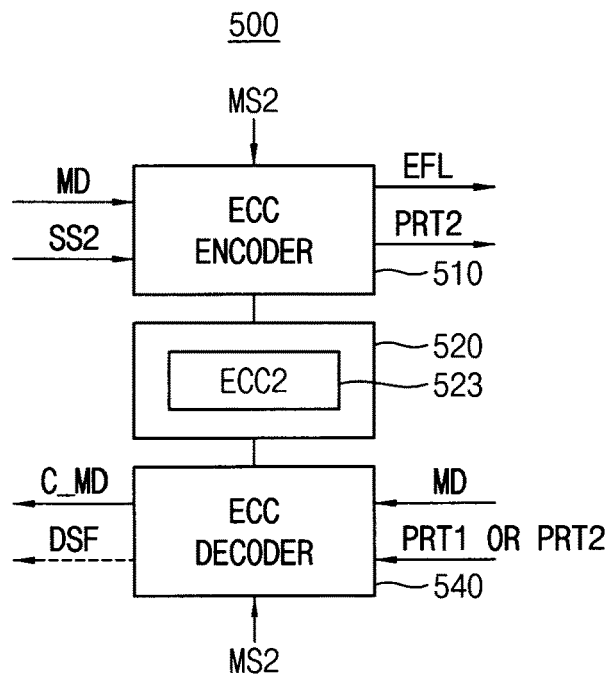
FIG. 9 is a block diagram illustrating the second ECC engine in FIG. 8 according to exemplary embodiments.

FIG. 9 is a block diagram illustrating the second ECC engine 500 in FIG. 8 according to exemplary embodiments.

Referring to FIG. 9, the second ECC engine 500 may include an ECC encoder 510 an ECC decoder 540 and the memory 520. The memory 520 stores a second ECC 523. The ECC encoder 510 and the ECC decoder 540 are connected to the memory 520.

The ECC encoder 510, in response to the mode signal MS and the second selection signal SS2, may generate the error flag EFL and the second parity data PRT2 in the second mode of the write operation and may generate the second parity data PRT2 in the third mode of the write operation, The ECC decoder 540, in response to the mode signal MS, may perform an ECC decoding on the main data MD based on one of the first parity data PRT1 and the second parity data PRT2 by using the second ECC 523 and may correct the single bit error in the main data MD or may correct the multi-bit error of one of symbols of the main data MD to output the corrected main data C-MD in the read operation.

Figure 10A:
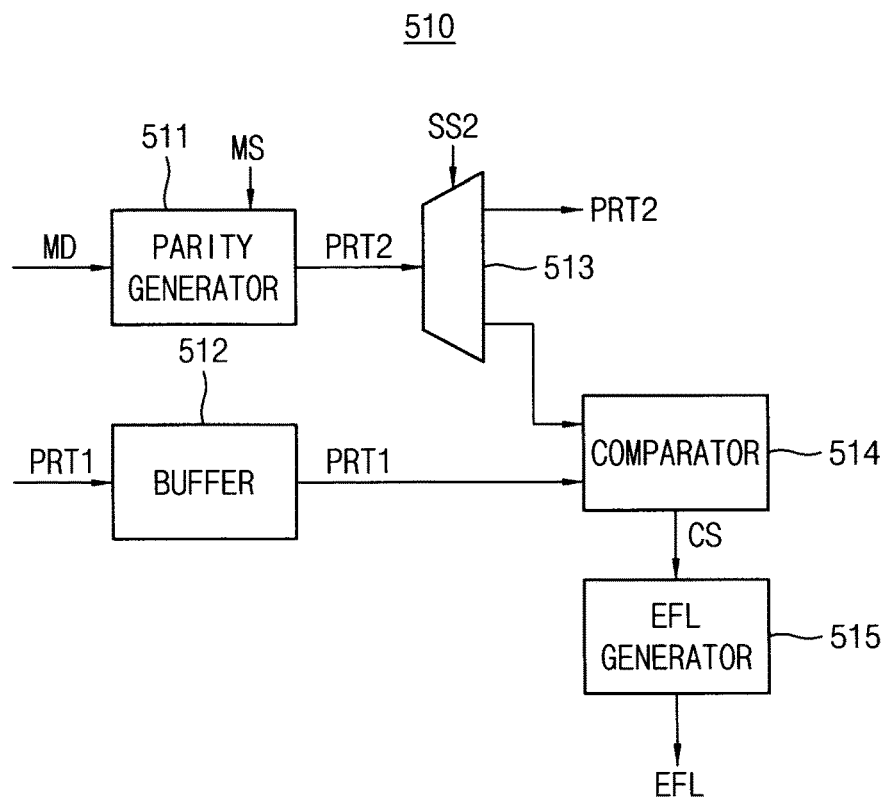
FIG. 10A illustrates an example of the ECC encoder in the second ECC engine of FIG. 9 according to exemplary embodiments.

FIG. 10A illustrates an example of the ECC encoder in the second ECC engine 500 of FIG. 9 according to exemplary embodiments.

Referring to FIG. 10A, the ECC encoder 510 may include a parity generator 511, a buffer 512, a selection circuit 513, a comparator 514 and an error flag generator 515.

The parity generator 511 is connected to the memory 520, generates the second parity data PRT2 based on the main data MD using the second ECC 522 and provides the second parity data PRT2 to the selection circuit 513. The selection circuit 513, in response to the second selection signal SS2, provides the second parity data PRT2 to the comparator 514 in the second mode of the write operation and provides the second parity data PRT2 to the target page in the third mode of the write operation.

The buffer 512 stores the first parity data PRT1 and provides the first parity data PRT1 to the comparator 514. The comparator 514 compares corresponding bits of the first parity data PRT1 and the second parity data PRT2 and provides the error flag generator 515 with a comparison signal CS indicating whether the second parity data PRT2 matches the first parity data PRT1 in the second mode of the write operation. The error flag generator 515 outputs the error flag EFL with a first logic level to the memory controller 20 in response to the comparison signal CS indicating that the second parity data PRT2 does not match the first parity data PRT1.

Figure 10B:
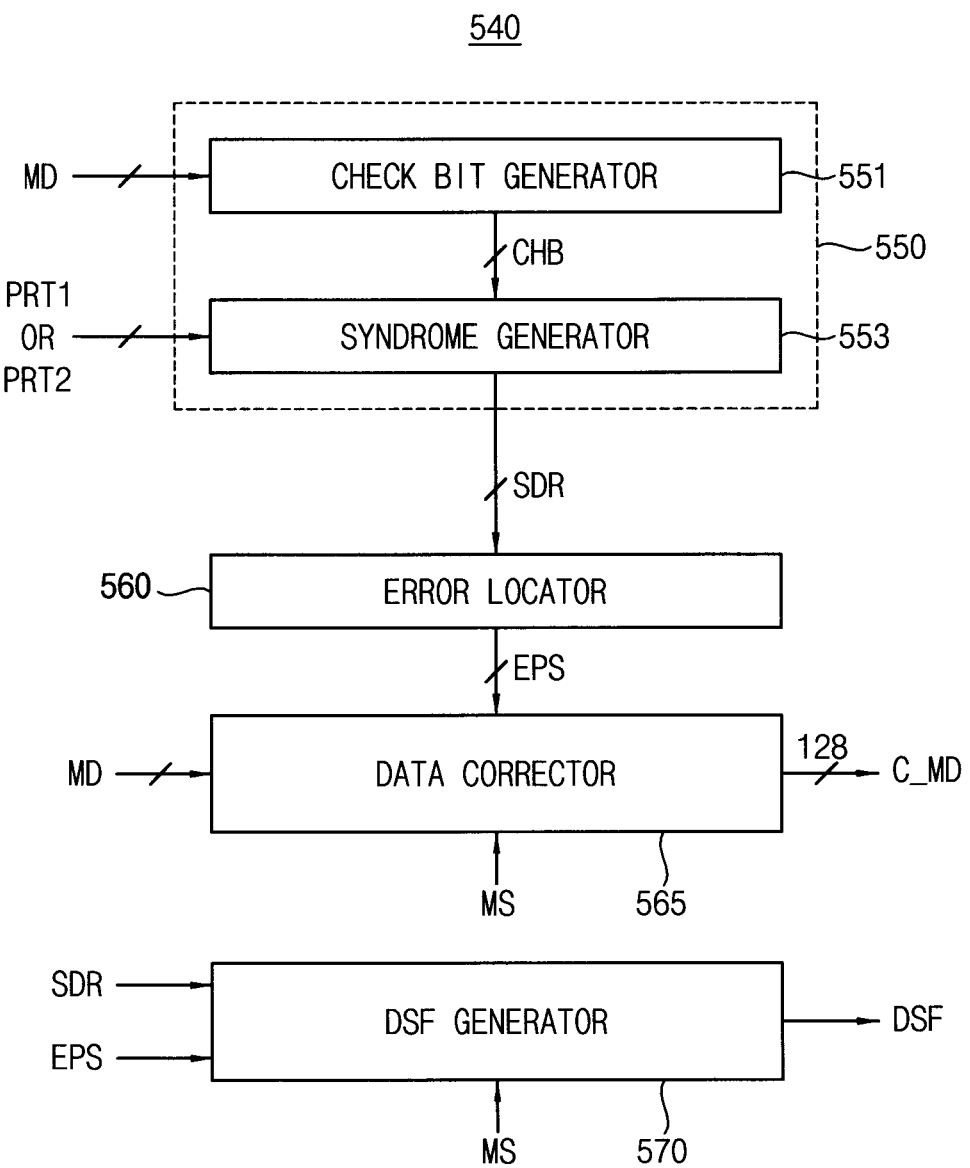
FIG. 10B illustrates an example of the ECC decoder in the second ECC engine of FIG. 9 according to exemplary embodiments.

FIG. 10B illustrates an example of the ECC decoder in the second ECC engine of FIG. 9 according to exemplary embodiments.

Referring to FIG. 10B, the ECC decoder 540 may include a syndrome generation circuit 550, an error locator 560, a data corrector 565 and a decoding status flag generator 570. The syndrome generation circuit 550 may include a check bit generator 551 and a syndrome generator 553.

The syndrome generation circuit 550 may include check bit generator 551 and the syndrome generator 553. The check bit generator 551 generates check bits CHB based on the main data MD by performing, an XOR array operation and the syndrome generator 553 generates a syndrome SDR by comparing corresponding bits of one of the first parity data PRT1 and the second parity data PRT2 and the check bits CHB. The syndrome generator 553 may provide the syndrome SDR to the decoding status flag generator 570.

The error locator 560 generates an error position signal EPS indicating a position of an error bit in the main data MD to provide the error position signal EPS to the data corrector 565 when all bits of the syndrome SDR are not 'zero'. In addition, the error locator 560 provides the error position signal EPS to the decoding status flag generator 570.

The data corrector 565 receives the read main data MD, corrects at least one error in the main data MD based on the error position signal EPS when the main data MD includes the at least one error and outputs the corrected main data C_MD. The data corrector 565 may output the corrected main data C_MD by correcting a single bit error in the main data MD or correcting the multi-bit error of one of the symbols of the main data MD in response to the mode signal MS, The decoding status flag generator 570 receives the syndrome SDR and the error position signal EPS and outputs the decoding status flag DSF including at least one of the syndrome SDR and the error position signal EPS. In this case, the decoding status flag DSF includes a plurality of bits and the decoding status flag DSF is transmitted to the memory controller 20 after the main data MD (or, the corrected main data C_MD) is transmitted to the memory controller 20.

In exemplary embodiments, the decoding status flag DSF may indicate that the at least one error in the main data MD is corrected. In this case, the decoding status flag DSF includes a single bit and the decoding status flag DSF is transmitted to the memory controller 20 through a pin such as a data mask pin simultaneously with the main data MD (or, the corrected main data C_MD) being transmitted to the memory controller 20.

Figure 11:
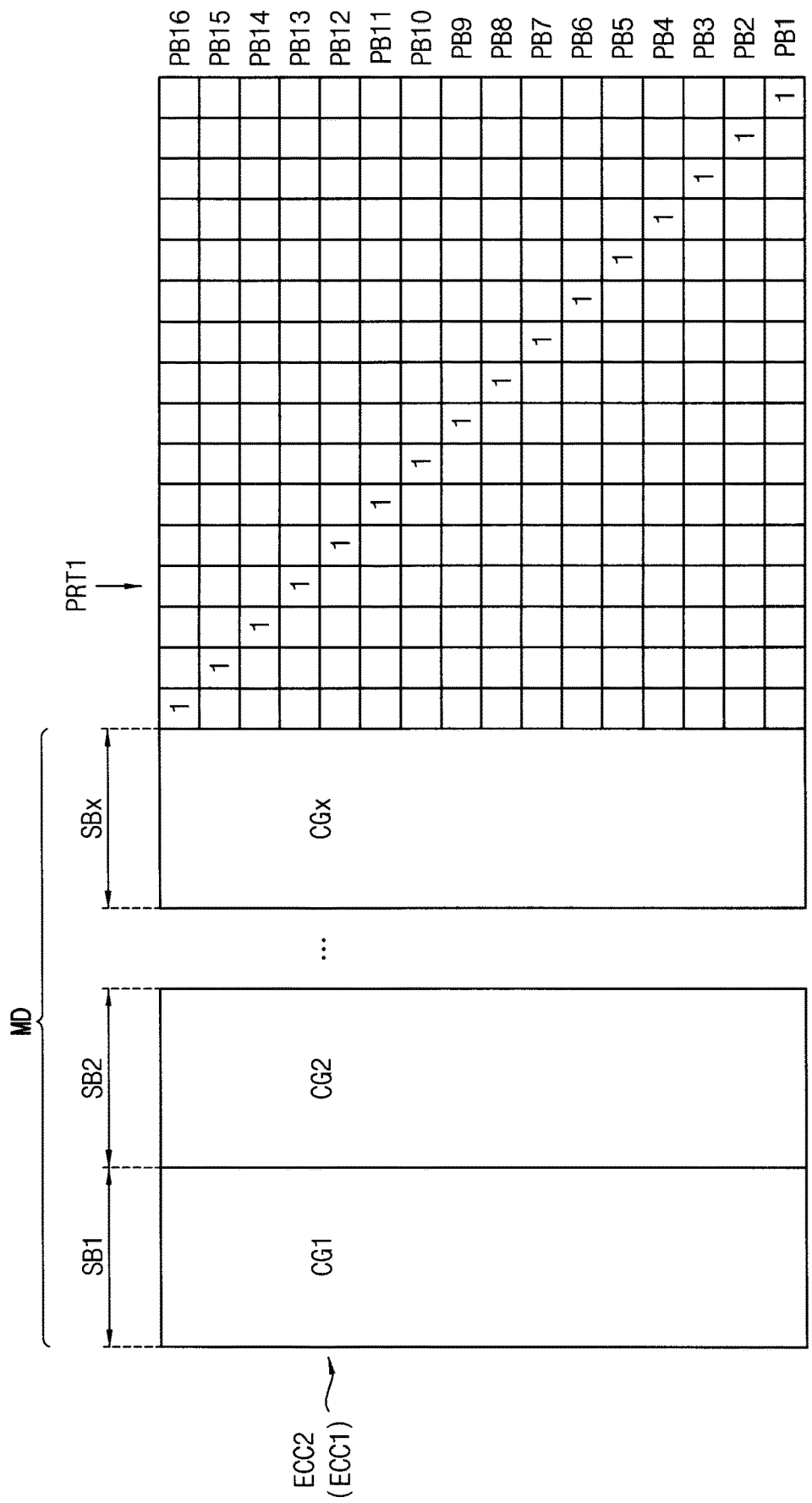
FIG. 11 illustrates an example of the second ECC in FIG. 11 according to exemplary embodiments.

FIG. 11 illustrates an example of the second ECC in FIG. 11 according to exemplary embodiments.

Referring to FIG. 11, the second ECC ECC2 may be divided into a plurality of code groups CG1~CGx corresponding to a plurality of symbols SB1~SBx included in the main data MD. The second ECC ECC2 may be represented as a generation matrix or a parity check matrix. The first parity data PRT1 may include a plurality of parity bits PB1~PB16. The parity check matrix of the second ECC ECC2 is the same as a parity check matrix of the first ECC 37 in FIG. 3.

Figure 12:
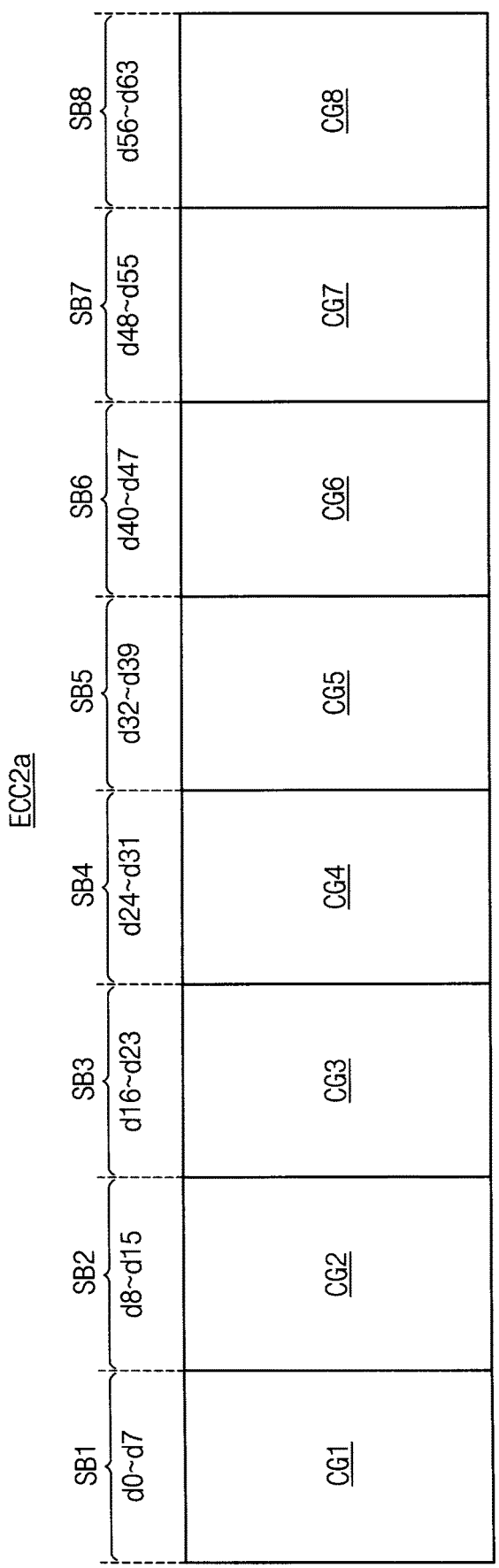
FIG. 12 illustrates an example of the second ECC of FIG. 11 according to exemplary embodiments.

FIG. 12 illustrates an example of the second ECC of FIG. 11 according to exemplary embodiments.

In FIG. 12, it is assumed that the main data MD includes 64-bit data bits d0~d63. That is, it is assumed that x is 8 in FIG. 12.

Referring to FIG. 12, the data bits d0~d63 of the main data MD may be divided into first through eighth symbols SB1~SB8. Each of the first through eighth symbols SB1~SB8 includes 8-bit data bits.

A second ECC ECC2a includes first through eighth code groups CG1~CG8 corresponding to the first through eighth symbols SB1~SB8.

Figure 13A:
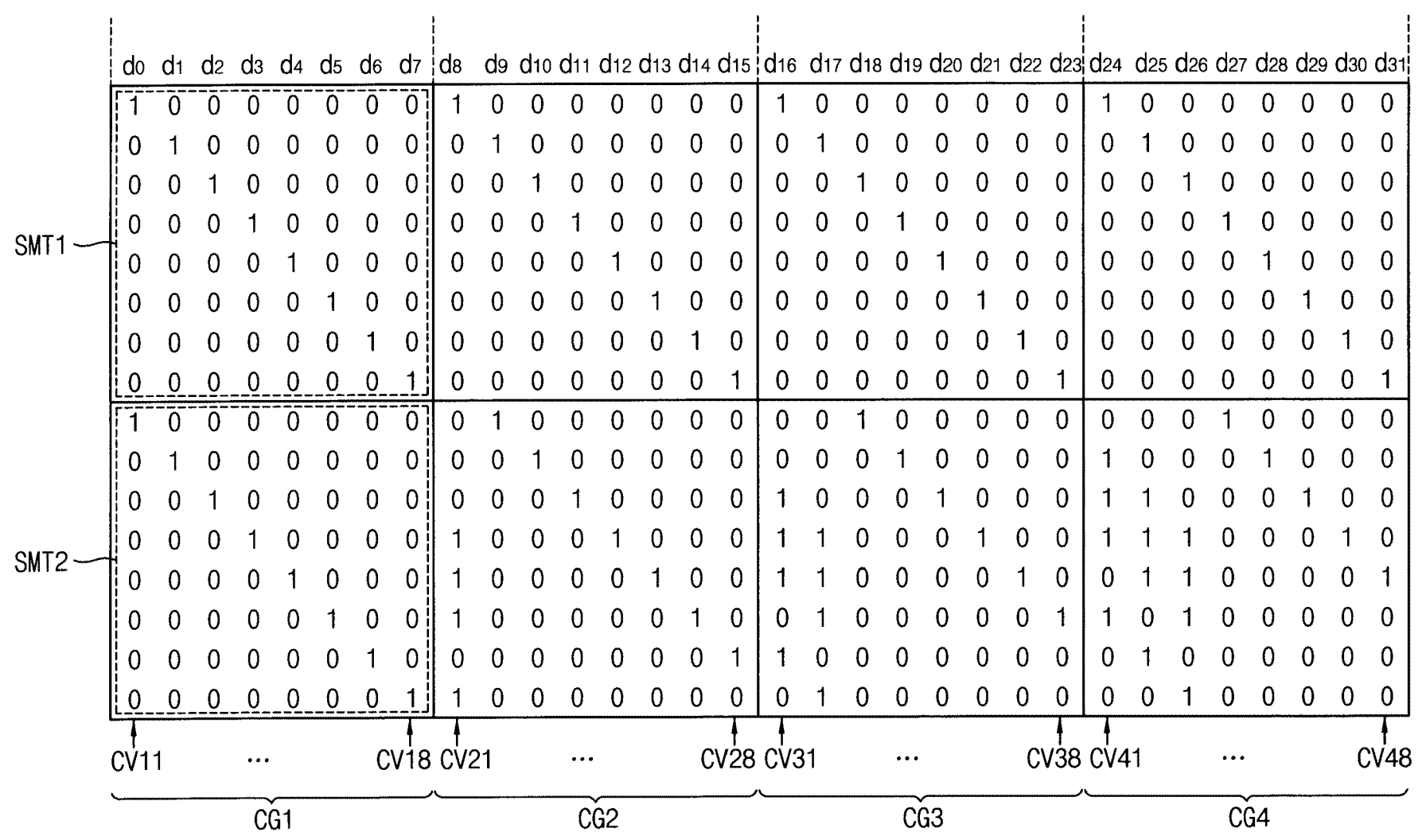
Figure 13B:
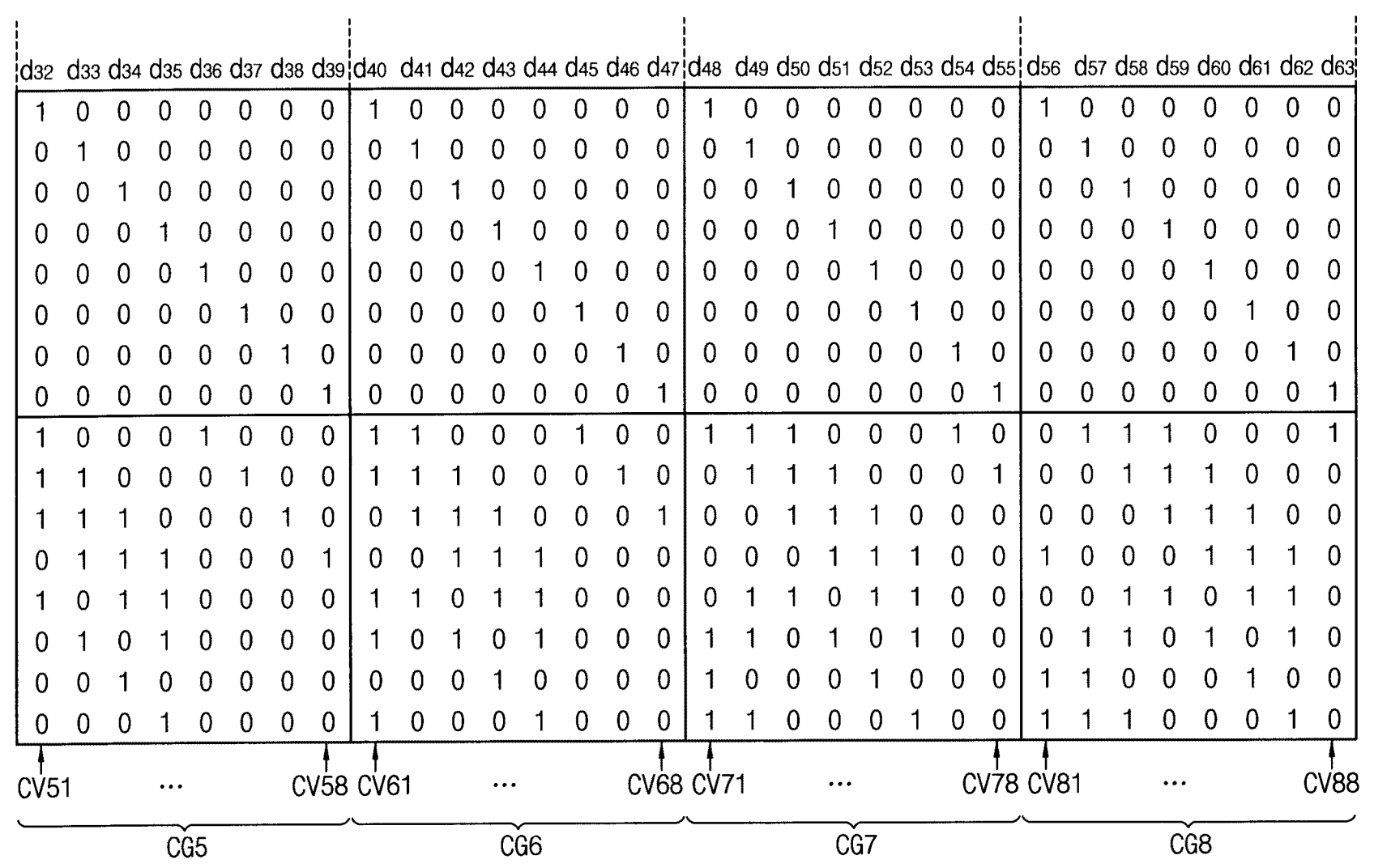

FIGS. 13A and 13B illustrate the first through eighth code groups in FIG. 12 according to exemplary embodiments.

Referring to FIGS. 12A and 12B, the first code group CG1 includes column vectors CV11~CV18 corresponding to the data bits d0~d7 of the first symbol SB1, the second code group CG2 includes column vectors CV21~CV28 corresponding to the data bits d8~d15 of the second symbol SB2, the third code group CG3 includes column vectors CV31~CV38 corresponding to the data bits d16~d23 of the third symbol SB3, and the fourth code group CG4 includes column vectors CV41~CV48 corresponding to the data bits d24~d31 of the fourth symbol SB4. In addition, the fifth code group CG5 includes column vectors CV51~CV58 corresponding to the data bits d32~d39 of the fifth symbol SB5, the sixth code group CG6 includes column vectors CV61~CV68 corresponding to the data bits d40~d47 of the sixth symbol SB6, the seventh code group CG7 includes column vectors CV71~CV78 corresponding to the data bits d48~d55 of the seventh symbol SB7, and the eighth code group CG8 includes column vectors CV81~CV88 corresponding to the data bits d56~d63 of the eighth symbol SB8.

In addition, each of the first through eighth code groups CG1~CG8 includes a first sub matrix SMT1 and a second sub matrix SMT2, the first sub matrix SMT1 has same elements in each of the first through eighth code groups CG1~CG8 and the second sub matrix SMT2 has different elements in each of the first through eighth code groups CG1~CG8. The first sub matrix SMT1 may correspond to a unit matrix.

Figure 14:
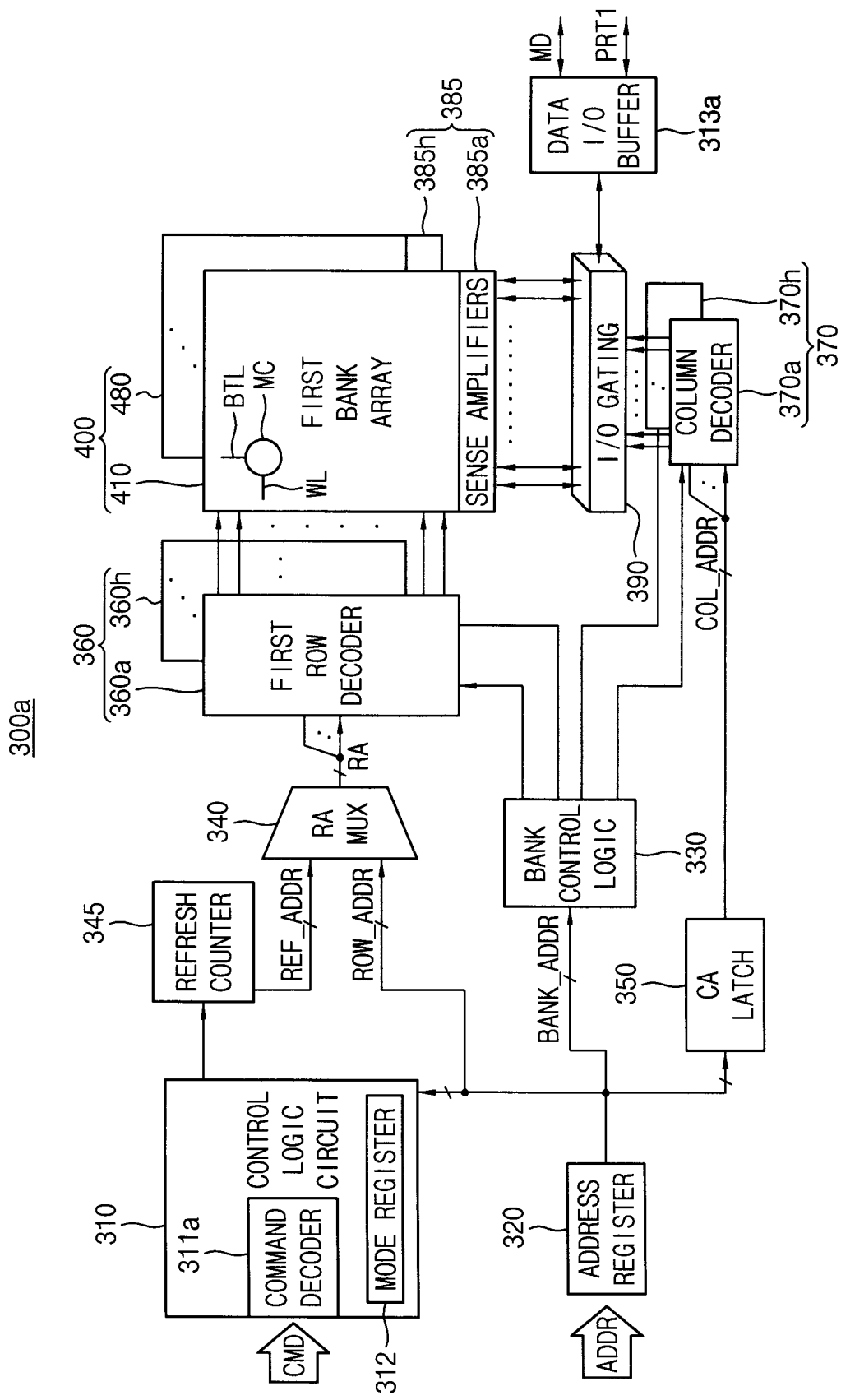
FIG. 14 is a block diagram illustrating one of the memory dies in the stacked memory device of FIG. 4 according to exemplary embodiments.

FIG. 14 is a block diagram illustrating one of the memory dies in the stacked memory device of FIG. 4 according to exemplary embodiments.

In FIG. 14, a configuration of the memory die 300a is illustrated and each configuration of the memory dies 300b-300k may be substantially the same as the configuration of the memory die 300a.

Referring to FIG. 14, the memory die 300a includes the control logic circuit 310, an address register 320, a bank control logic 330, a refresh counter 345, a row address multiplexer 340, a column address latch 350, a row decoder 360, a column decoder 370, the memory cell array 400, a sense amplifier unit 385, an I/O gating circuit 390, and a data I/O buffer 313a.

The memory cell array 400 includes first through eighth bank arrays 410~480. The row decoder 360 includes first through eighth bank row decoders 360a-360h respectively coupled to the first through eighth bank arrays 410~480, the column decoder 370 includes first through eighth bank column decoders 370a-370h respectively coupled to the first through eighth bank arrays 410~480, and the sense amplifier unit 385 includes first through eighth bank sense amplifiers 385a-385h respectively coupled to the first through eighth bank arrays 410~480.

The first through eighth bank arrays 410~480, the first through eighth bank row decoders 360a-360h, the first through eighth bank column decoders 370a-370h and first through eighth bank sense amplifiers 385a-385h may form first through eighth banks. Each of the first through eighth bank arrays 410~480 includes a plurality of memory cells MC formed at intersections of a plurality of word-lines WL and a plurality of bit-line BTL.

The address register 320 receives the address ADDR including a bank address BANK_ADDR, a row address ROW_ADDR and a column address COL_ADDR from an outside. The address register 320 provides the received bank address BANK_ADDR to the bank control logic 330, provides the received row address ROW_ADDR to the row address multiplexer 340, and provides the received column address COL_ADDR to the column address latch 350.

The bank control logic 330 generates bank control signals in response to the bank address BANK_ADDR. One of the first through eighth bank row decoders 360a-360h corresponding to the bank address BANK_ADDR is activated in response to the bank control signals, and one of the first through eighth bank column decoders 370a-370h corresponding to the bank address BANK_ADDR is activated in response to the bank control signals.

The row address multiplexer 340 receives the row address ROW_ADDR from the address register 320, and receives a refresh row address REF_ADDR from the refresh counter 345. The row address multiplexer 340 selectively outputs the row address ROW_ADDR or the refresh row address REF_ADDR as a row address RA. The row address RA that is output from the row address multiplexer 340 is applied to the first through eighth bank row decoders 360a-360h.

The refresh counter 345 may sequentially output the refresh row address REF_ADDR under control of the control logic circuit 310.

The activated one of the first through eighth bank row decoders 360a-360h, by the bank control logic 330, decodes the row address RA that is output from the row address multiplexer 340, and activates a word-line corresponding to the row address RA. For example, the activated bank row decoder applies a word-line driving voltage to the word-line corresponding to the row address.

The column address latch 350 receives the column address COL_ADDR from the address register 320, and temporarily stores the received column address COL_ADDR. In some embodiments, in a burst mode, the column address latch 350 generates column addresses that increment from the received column address COL_ADDR. The column address latch 350 applies the temporarily stored or generated column address to the first through eighth bank column decoders 370a-370h.

The activated one of the first through eighth bank column decoders 370a-370h activates a sense amplifier corresponding to the bank address BANK_ADDR and the column address COL_ADDR through the I/O gating circuit 390.

The I/O gating circuit 390 includes a circuitry for gating input/output data, and further includes input data mask logic, read data latches for storing data that is output from the first through eighth bank arrays 410~480, and write drivers for writing data to the first through eighth bank arrays 410~480.

Data (including the main data the first parity data) read from one bank array of the first through eighth bank arrays 410~480 is sensed by a sense amplifier coupled to the one bank array from which the data is to be read, and is stored in the read data latches. The data stored in the read data latches may be provided to the outside or another memory die through the data processor 313a.

The data to be written in one bank array of the first through eighth bank arrays 410~480 may be provided to the I/O gating circuit 390 and the I/O gating circuit 390 may write the data in one bank array through the write drivers.

The data I/O buffer 313a may store the main data MD and the first parity data PRT1 in the memory cell array 400 through the I/O gating circuit 390 in a write operation and may provide the main data MD and the first parity data PRT1 to the interface circuit 230 through the I/O gating circuit 390 in a read operation.

The control logic circuit 310 may control operations of the memory die 300a. For example, the control logic circuit 310 may generate control signals for the memory die 300a in order to perform a write operation or a read operation. The control logic circuit 310 includes a command decoder 311a that decodes the command CMD received from the internal command generator 210 and a mode register 312 that sets an operation mode of the memory die 300a.

Figure 15:
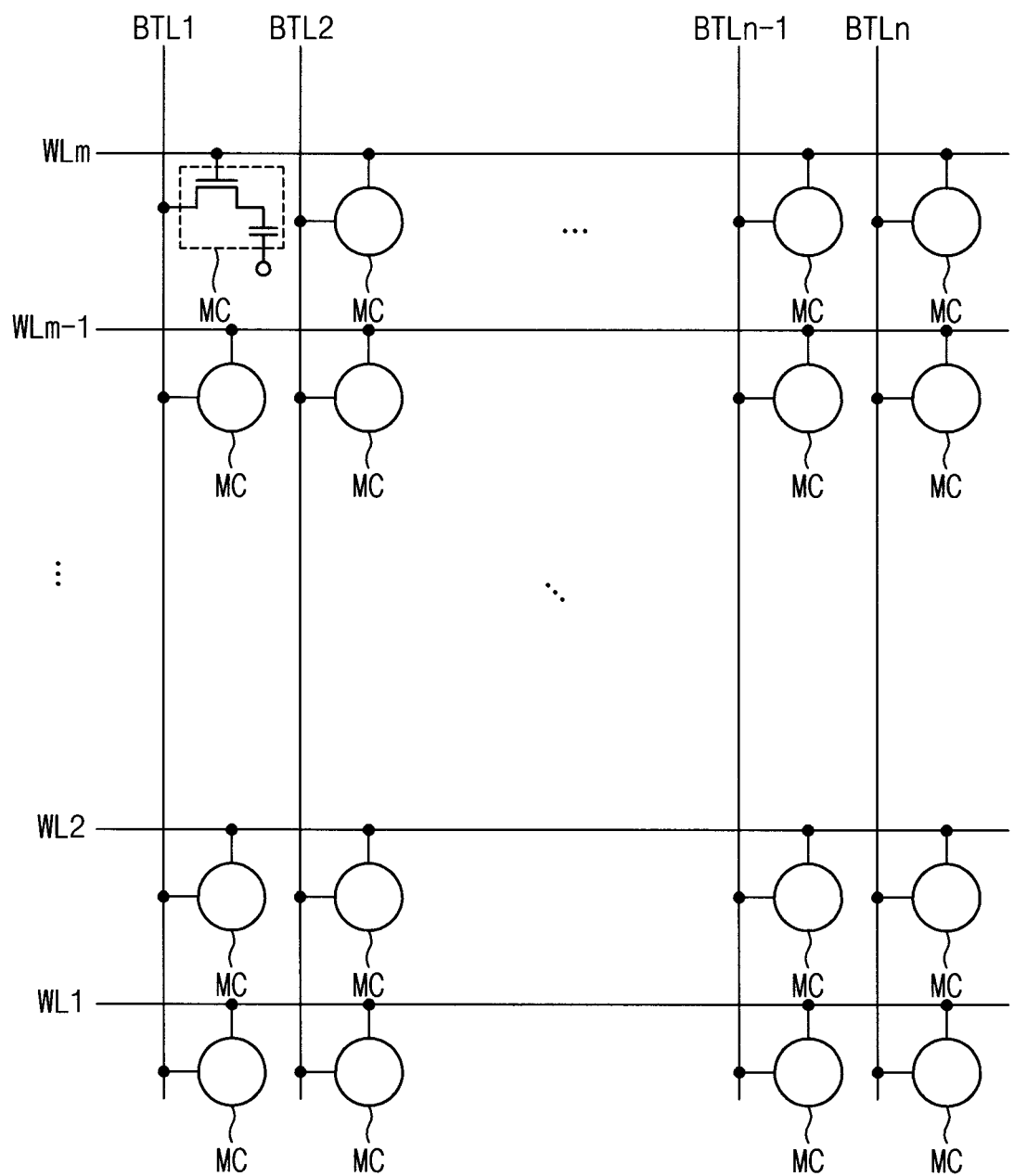
FIG. 15 illustrates an example of the first bank array in the memory die of FIG. 14.

FIG. 15 illustrates an example of the first bank array in the memory die of FIG. 14.

Referring to FIG. 15, the first bank array 410 includes a plurality of word-lines WL1~WLm (m is a natural number greater than two), a plurality of bit-lines BTL1~BTLn (n is a natural number greater than two), and a plurality of dynamic memory cells MCs disposed at intersections between the word-lines WL1~WLm and the bit-lines BTL1~BTLn. Each of the dynamic memory cells MCs includes a cell transistor coupled to each of the word-lines WL1~WLm and each of the bit-lines BTL1~BTLn and a cell capacitor coupled to the cell transistor. The first bank array 410 may include a normal cell region to store the main data MD, and a parity cell region to store the first parity data PRT1.

In FIGS. 14 and 15, it is illustrated as the memory die 300a is implemented with DRAM including volatile memory cells. In exemplary embodiments, each of the memory dies 300a-300k may be implemented with a resistive memory device including resistive memory cells or other memory device.

Figure 16A:
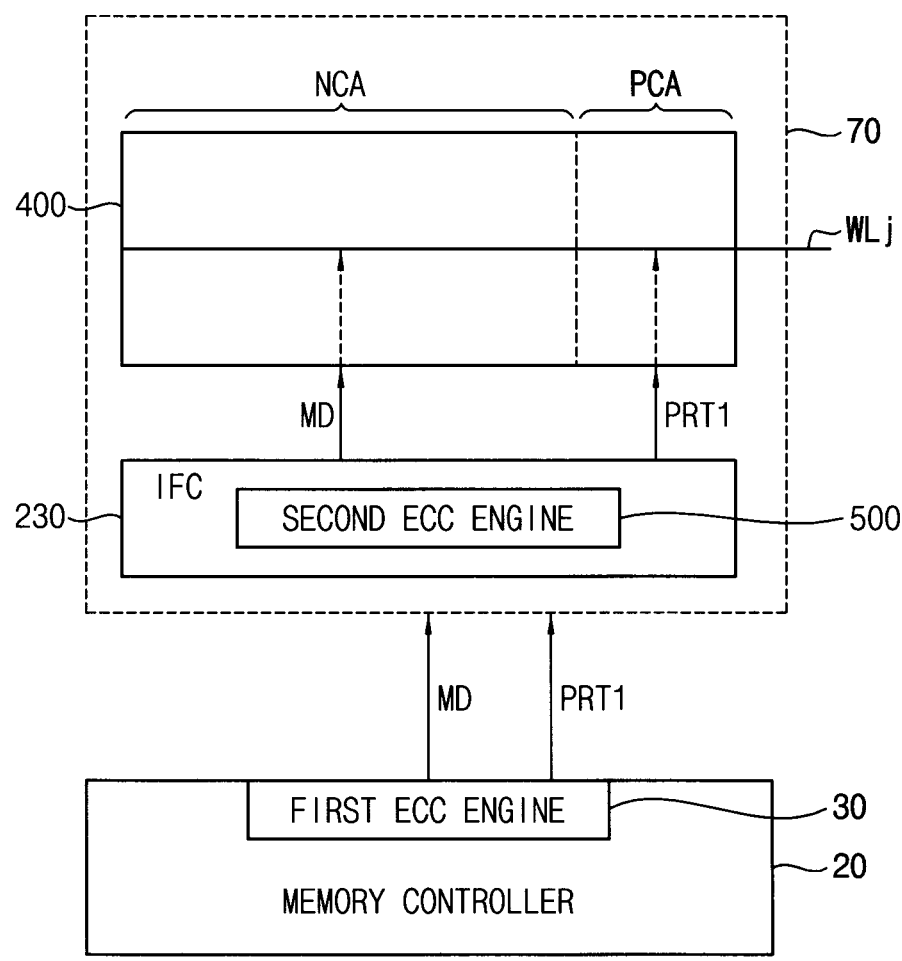
FIGS. 16A through 16C illustrate exemplary embodiments in which data is exchanged between the memory controller and the stacked memory device in the memory system of FIG. 2 in a write operation.
Figure 16B:
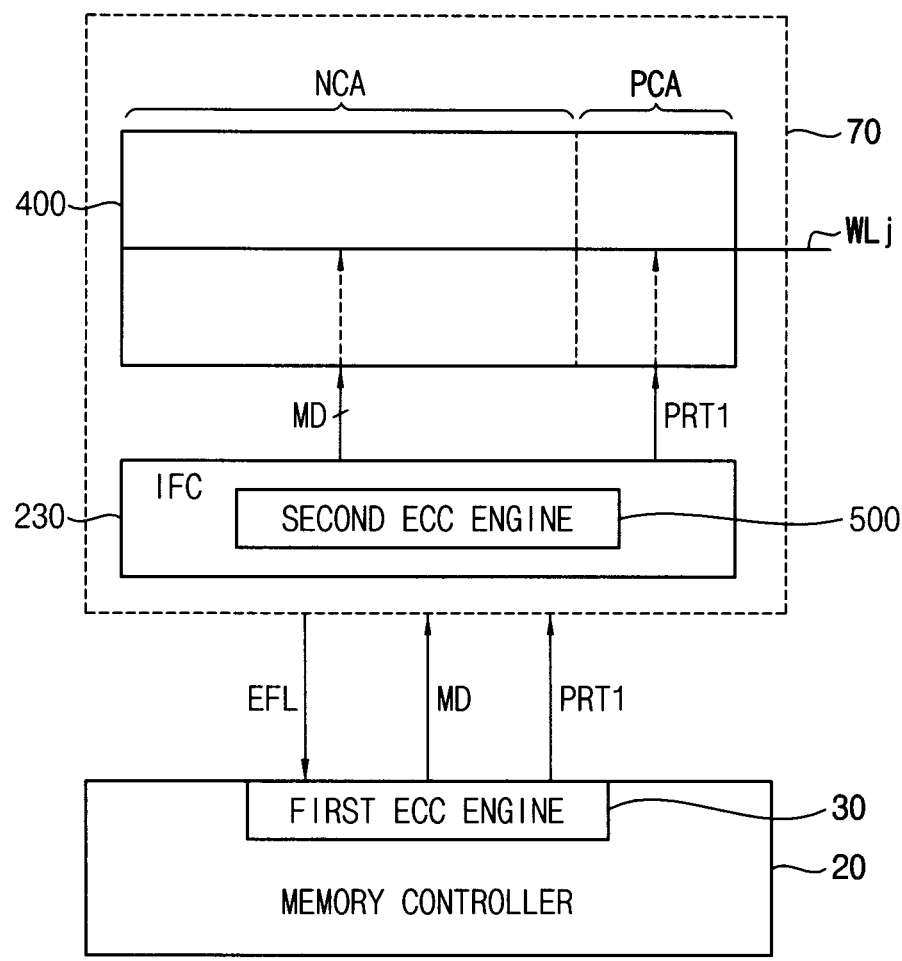
Figure 16C:
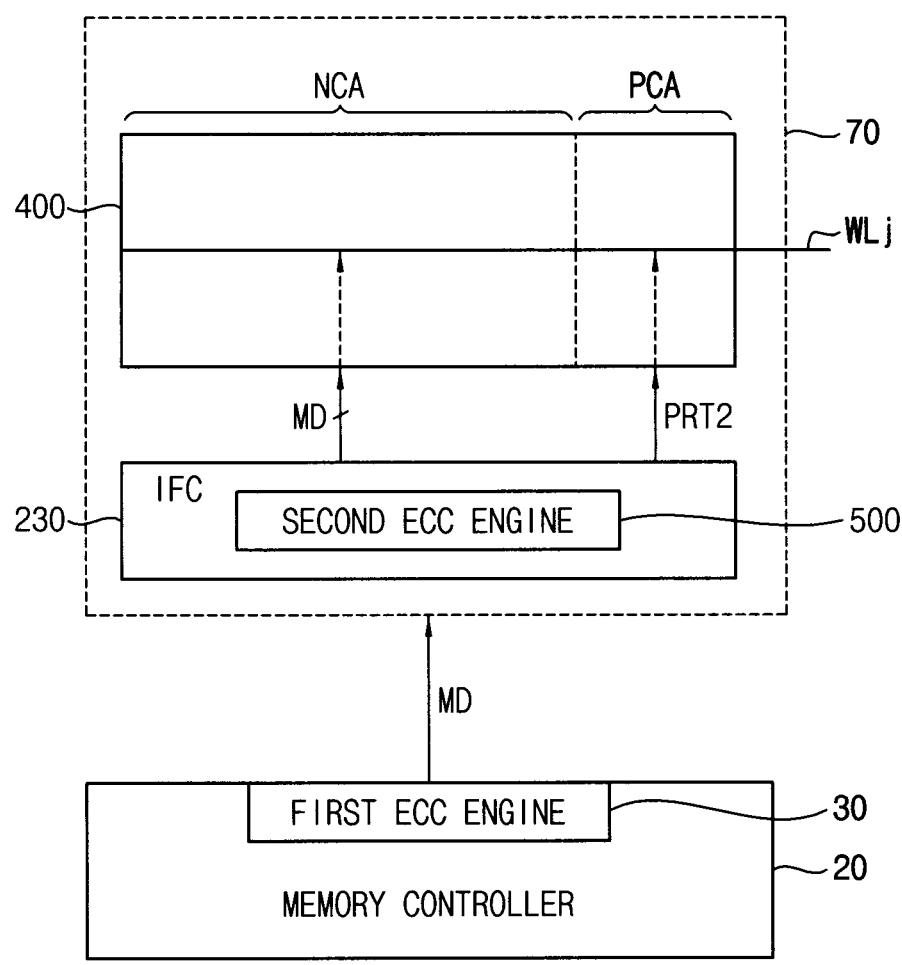

FIGS. 16A through 16C illustrate an exemplary embodiment in which the data is exchanged between the memory controller and the stacked memory device in the memory system of FIG. 2 in a write operation.

Figure 17A:
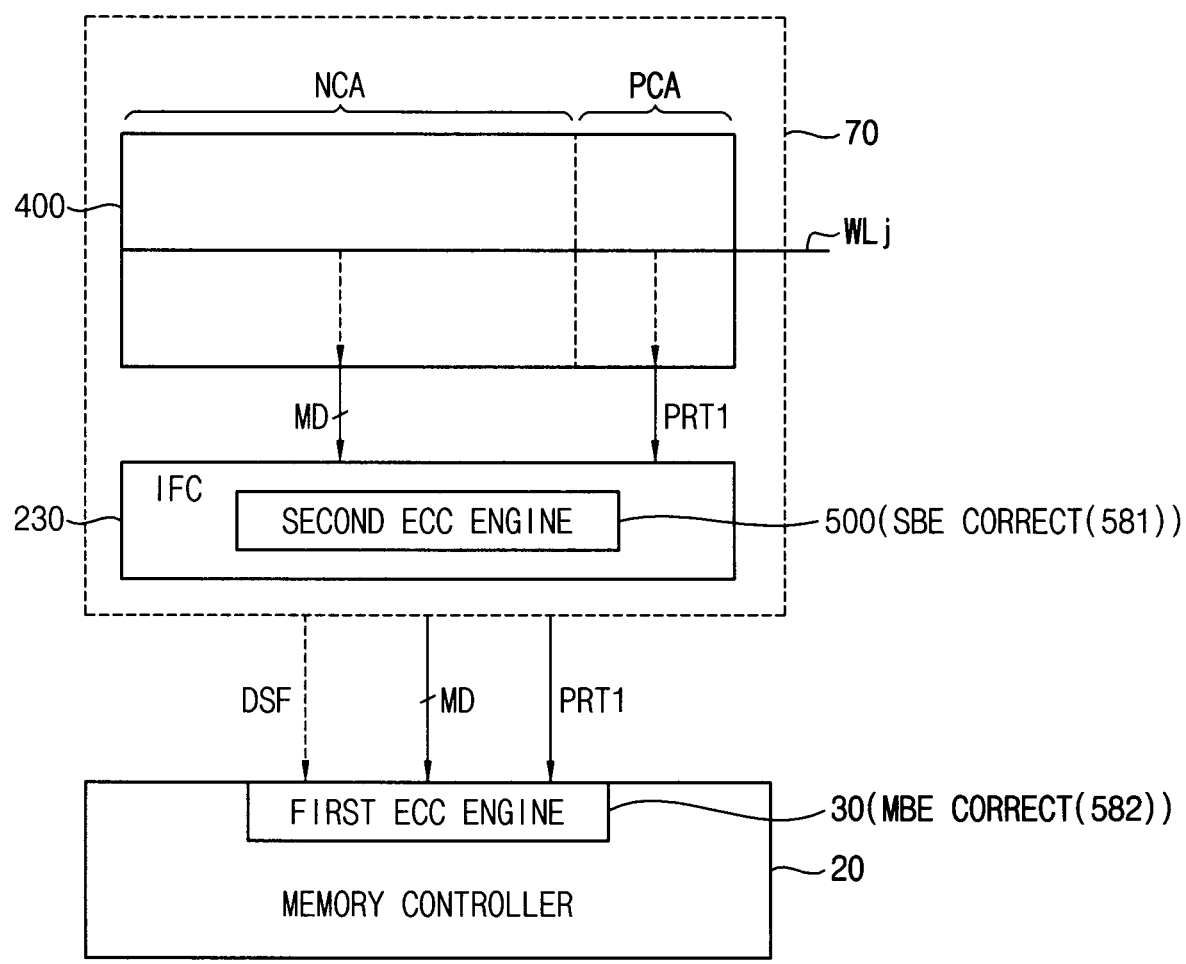
FIGS. 17A through 17C illustrate exemplary embodiments in which data is exchanged between the memory controller and the stacked memory device in the memory system of FIG. 2 in a read operation.
Figure 17B:
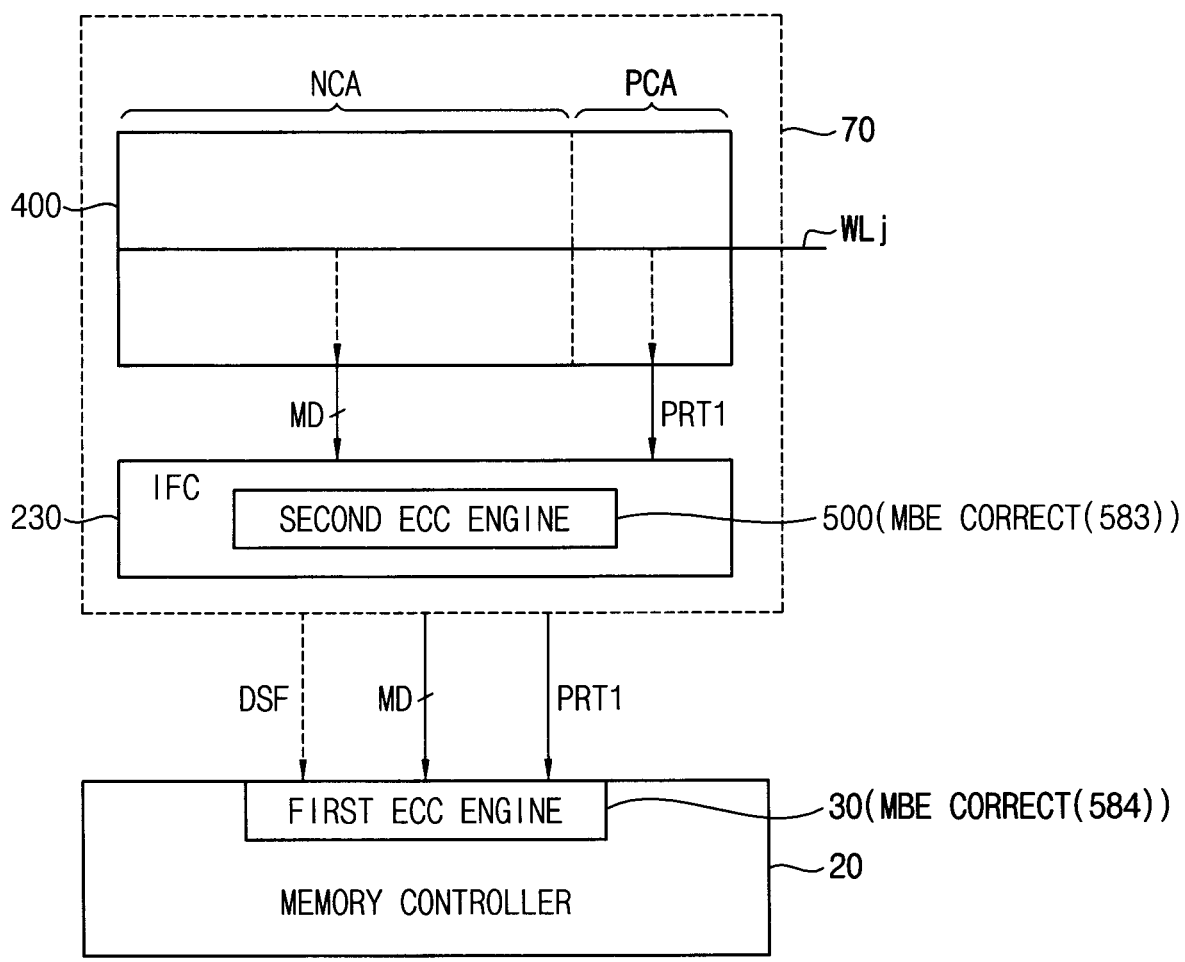
Figure 17C:
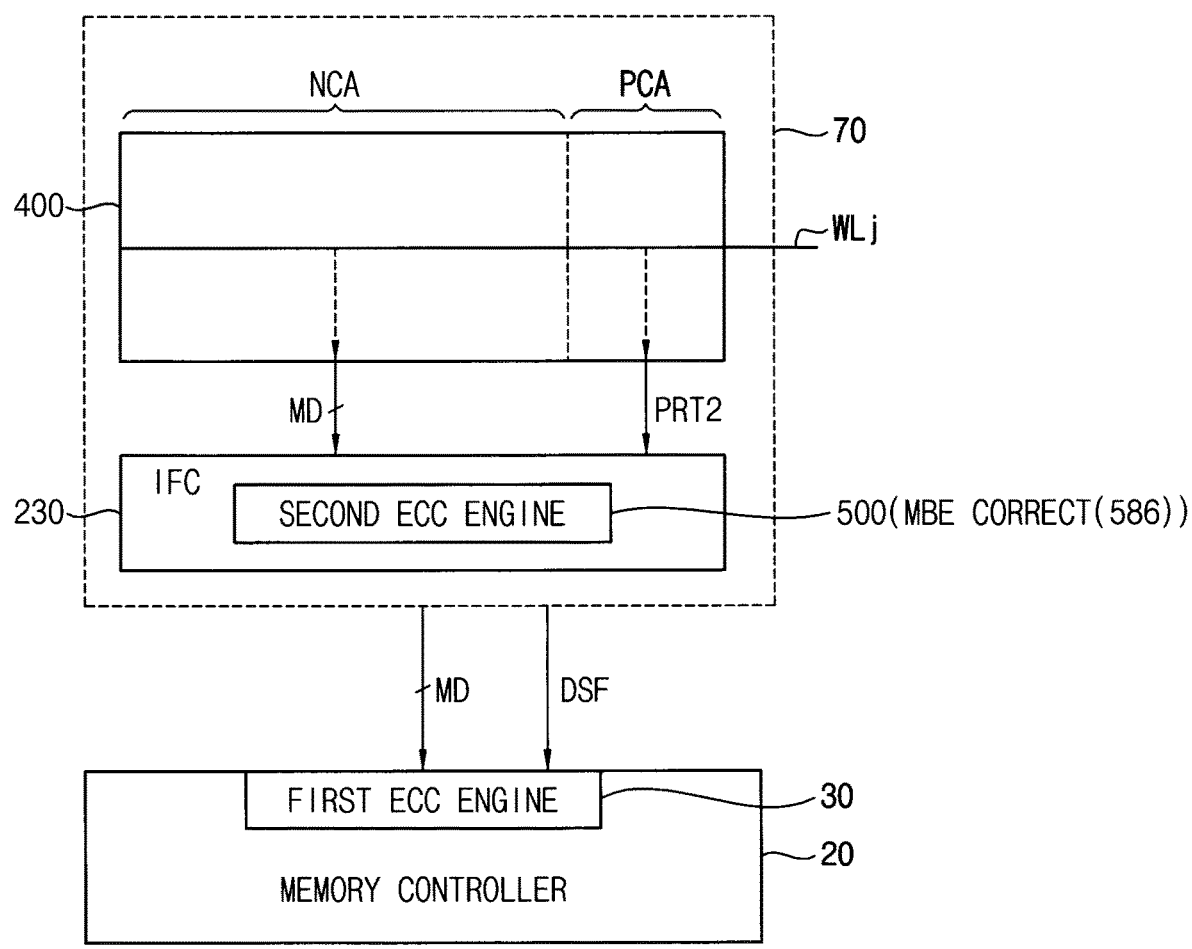

FIGS. 17A-17C illustrate an exemplary embodiment in which the data is exchanged between the memory controller and the stacked memory device in the memory system of FIG. 2 in a read operation.

Referring to FIGS. 16A through 16C and FIGS. 17A-17C, the memory cell array 400 includes a normal cell region NCA and a parity cell region PCA, the memory controller 20 includes the first ECC engine 30 and the stacked memory device 70 include the interface circuit 230 that includes the second ECC engine 500.

FIGS. 16A through 16C illustrate that data is exchanged in the memory system in a write operation.

Referring to FIG. 16A, in the first mode of the write operation, the first ECC engine 30 performs an ECC encoding on the main data MD using the first ECC to generate the first parity data PRT1 and provides the main data MD and the first parity data PRT1 to the stacked memory device 70. The second ECC engine 500 does not perform an ECC encoding and the interface circuit 230 stores the main data MD and the first parity data PRT1 in a target page coupled to a word-line WLj in the memory cell array 400.

Referring to FIG. 16B, in the second mode of the write operation, the second ECC engine 500 receives the main data MD and the first parity data PRT1 from the memory controller 20, perform an ECC encoding on the main data MD using the second ECC to generate the second parity data PRT2, compares the first parity data PRT1 and the second parity data PRT2, transmits the error flag EFL to the memory controller 20 in response to the second parity data PRT2 being not the same as the first parity data PRT2, re-receives the main data MD and the first parity data PRT1 from the memory controller 20, and stores the main data MD and the first parity data PRT1 in the target page coupled to the word-line WLj in the memory cell array 400.

Referring to FIG. 16C, in the third mode of the write operation, the memory controller 20 provides the main data MD to the stacked memory device 70, the second ECC, perform an ECC encoding on the main data MD using the second ECC to generate the second parity data PRT2, and stores the main data MD and the second parity data PRT2 in the target page coupled to the word-line WLj in the memory cell array 400.

FIGS. 17A through 17C illustrate that data is exchanged in the memory system in a read operation.

Referring to FIG. 17A, in a first mode of the read operation, the second ECC engine 500 reads the main data MD and the first parity data PRT1 from the target page coupled to the word-line WLj in the memory cell array 400, performs an ECC decoding on the main data MD and the first parity data PRT1 using the second ECC to correct a single bit error (SBE) (which is a first type of error) in the main data MD (SBE correct represented by a reference numeral 581) and transmits the main data MD and the first parity data PRT1 to the memory controller 20. The first ECC engine 30 performs an ECC decoding on the main data MD and the first parity data PRT1 using the first ECC to correct a multi-bit error (MBE) (a second type of error) in the main data MD (MBE correct represented by a reference numeral 582). In exemplary embodiments, the second ECC engine 500 may transmit, to the memory controller 20, the decoding status flag (DSF) indicating that that the single bit error is corrected.

Referring to FIG. 17B, in a second mode of the read operation, the second ECC engine 500 reads the main data MD and the first parity data PRT1 from the target page coupled to the word-line WLj in the memory cell array 400, performs an ECC decoding on the main data MD and the first parity data PRT1 using the second ECC to correct a multi-bit bit error (a first type of error) in the main data MD (MBE correct represented by a reference numeral 583) and transmits the main data MD and the first parity data PRT1 to the memory controller 20. The first ECC engine 30 performs an ECC decoding on the main data MD and the first parity data PRT1 using the first ECC to correct a multi-bit transmission error (a second type of error) in the main data MD (MBE correct represented by a reference numeral 584). The transmission error is generated during the main data MD is being transmitted to the memory controller 20 from the stacked memory device 70. In exemplary embodiments, the second ECC engine 500 may transmit, to the memory controller 20, the decoding status flag (DSF) indicating that that the multi-bit bit error is corrected.

Referring to FIG. 17C, in a third mode of the read operation, the second ECC engine 500 reads the main data MD and the second parity data PRT2 from the target page coupled to the word-line WLj in the memory cell array 400, performs an ECC decoding on the main data MD and the second parity data PRT2 using the second ECC to correct a multi-bit bit error in the main data MD (MBE correct represented by a reference numeral 586) and transmits the main data MD and the decoding status flag DSF including information associated with the multi-bit bit error to the memory controller 20. The first ECC engine 30 receives the main data MD and the decoding status flag DSF and determines a position of the multi-bit bit error based on the decoding status flag DSF.

Referring to FIGS. 7 through 17C, the main data MD includes $2^s$-bit of data bits (s is a natural number equal to or greater than six), each of the first parity data PRT1 and the second parity data PRT2 includes $2^{(s-2)}$-bit of parity bits and the data bits of the main data MD include the first through eighth symbols, each including $2^{(s-3)}$ bits. For example, in a case s is 6, main data MD includes $2^6$ bit of data bits (64 bits), the first parity data includes $2^{(6-2)}$ bit of data bits, which is 16, and the symbols include $2^{(6-3)}$ bit of data bits, which is 8. The second ECC engine 500 may correct the first type of error in the main data MD and the first ECC engine 30 may correct the second type of error in the main data MD. In an exemplary embodiment, the first type of error may correspond to a single bit error and the second type of error may correspond to a multi-bit error. In an exemplary embodiment, when the first type of error may correspond to a multi-bit error, the second type of error may correspond to a transmission error.

In addition, the first ECC engine 30 and the second ECC engine 500 share the same parity check matrix because the first ECC engine 30 and the second ECC engine 500 share the same ECC, the first ECC engine 30 and the second ECC engine 500 may generate the same parity data based on the same ECC and first ECC engine 30 and the second ECC engine 500 may correct different types of error in the ECC decoding using the same ECC.

Figure 18A:
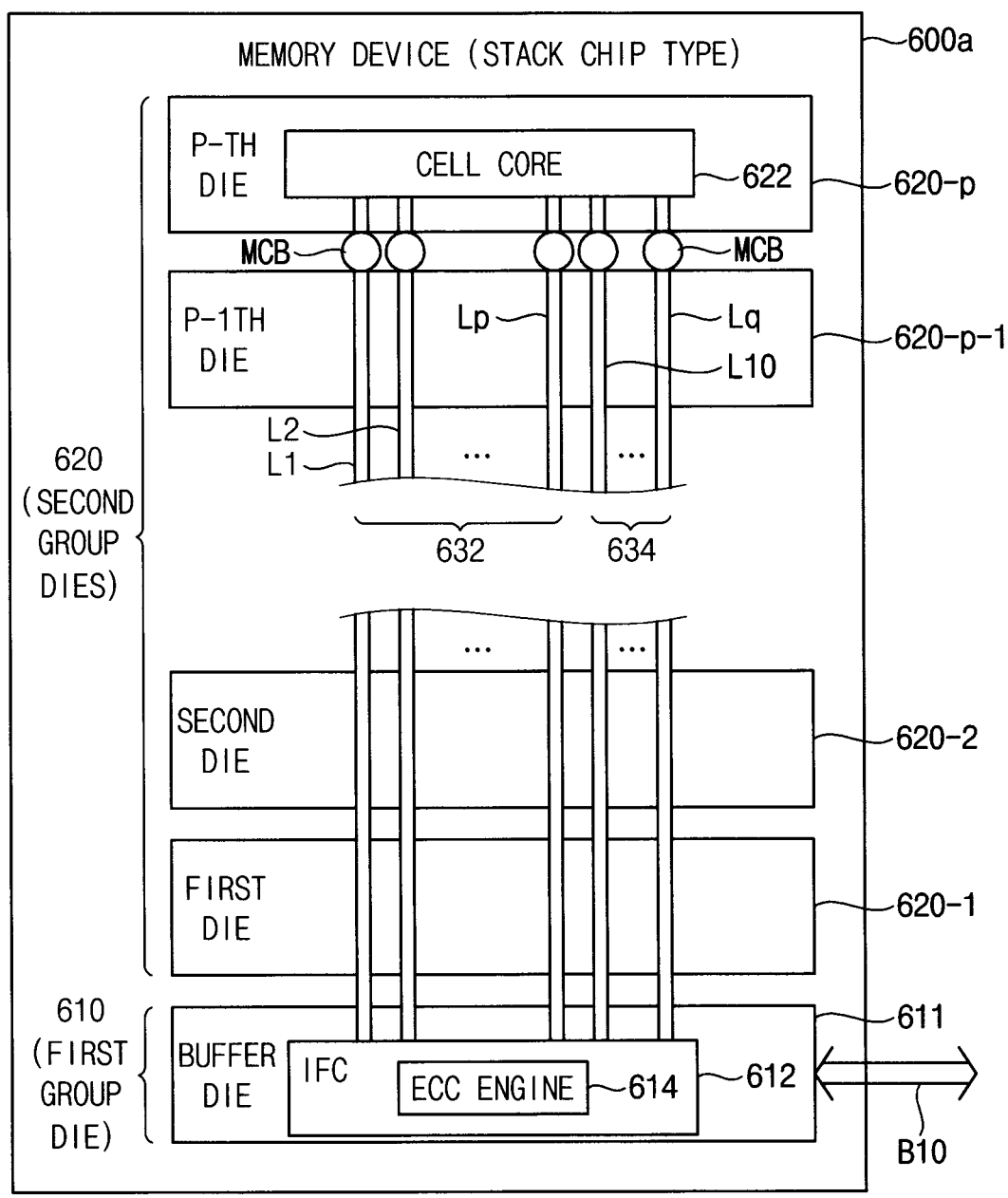
FIG. 18A is a block diagram illustrating a semiconductor memory device according to exemplary embodiments.

FIG. 18A is a block diagram illustrating a semiconductor memory device according to exemplary embodiments.

Referring to FIG. 18, a semiconductor memory device 600a may include a first group of die 610 and a second group of die 620 providing a stacked chip structure.

The first group of die 610 may include at least one buffer die 611. The second group of die 620 may include a plurality of memory dies 620-1 to 620-p which is stacked on the at least one buffer die 611 and conveys data through a plurality of through substrate via (or, through silicon via (TSV)) lines.

Each of the memory dies 620-1 to 620-p may include a cell core 622 to store data and parity. The cell core 622 may include a normal cell region to store main data, and a parity cell region to store a parity data.

The buffer die 611 may include an interface circuit 612 and the interface circuit 612 may include an ECC engine 614. The interface circuit 612 may employ the interface circuit 230 in FIG. 8 and the ECC engine 614 may employ the ECC engine 500 of FIG. 9. Therefore, the interface circuit 612 and the first ECC engine 30 in FIG. 3 shares the same ECC to share the same parity check matrix, may generate the same parity data based on the same ECC and may correct different types of error in the ECC decoding using the same ECC The semiconductor memory device 600a may be a stack chip type memory device or a stacked memory device which conveys data and control signals through the TSV lines. The TSV lines may be also called 'through electrodes'.

With the above description, a data TSV line group 632 which is formed at one memory die 620-p may include a plurality of TSV lines L1 to Lp, and a parity TSV line group 634 may include a plurality of TSV lines L10 to Lq. The TSV lines L71 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor. The semiconductor memory device 600 may have a three-dimensional (3D) chip structure or a 2.5D chip structure to communicate with the host through a data bus B10. The buffer die 611 may be connected with the memory controller through the data bus B10.

Figure 18B:
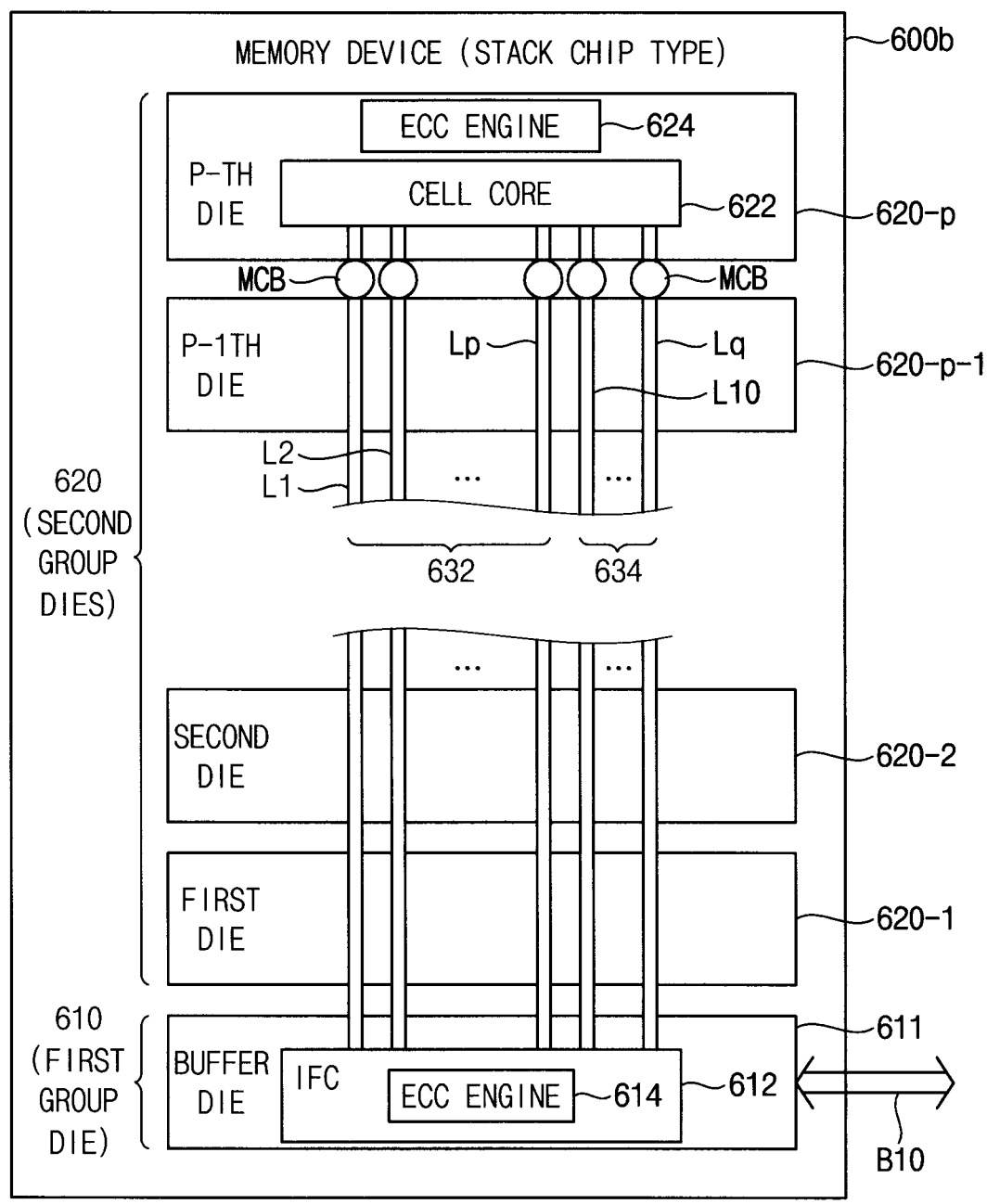
FIG. 18B is a block diagram illustrating a semiconductor memory device according to other exemplary embodiments.

FIG. 18B is a block diagram illustrating a semiconductor memory device according to other exemplary embodiments.

A semiconductor memory device 600*b* of FIG. 18B differs from the semiconductor memory device 600*a* of FIG. 18A in that the memory die 620-*p* further includes a cell core ECC engine 624.

The cell core ECC engine 624 share the same ECC as the ECC engine 614 to share the same parity check matrix as the ECC engine 614, performs an ECC encoding on data provided through the TSV lines and performs an ECC decoding on the data provided from the cell core 622.

Figure 19:
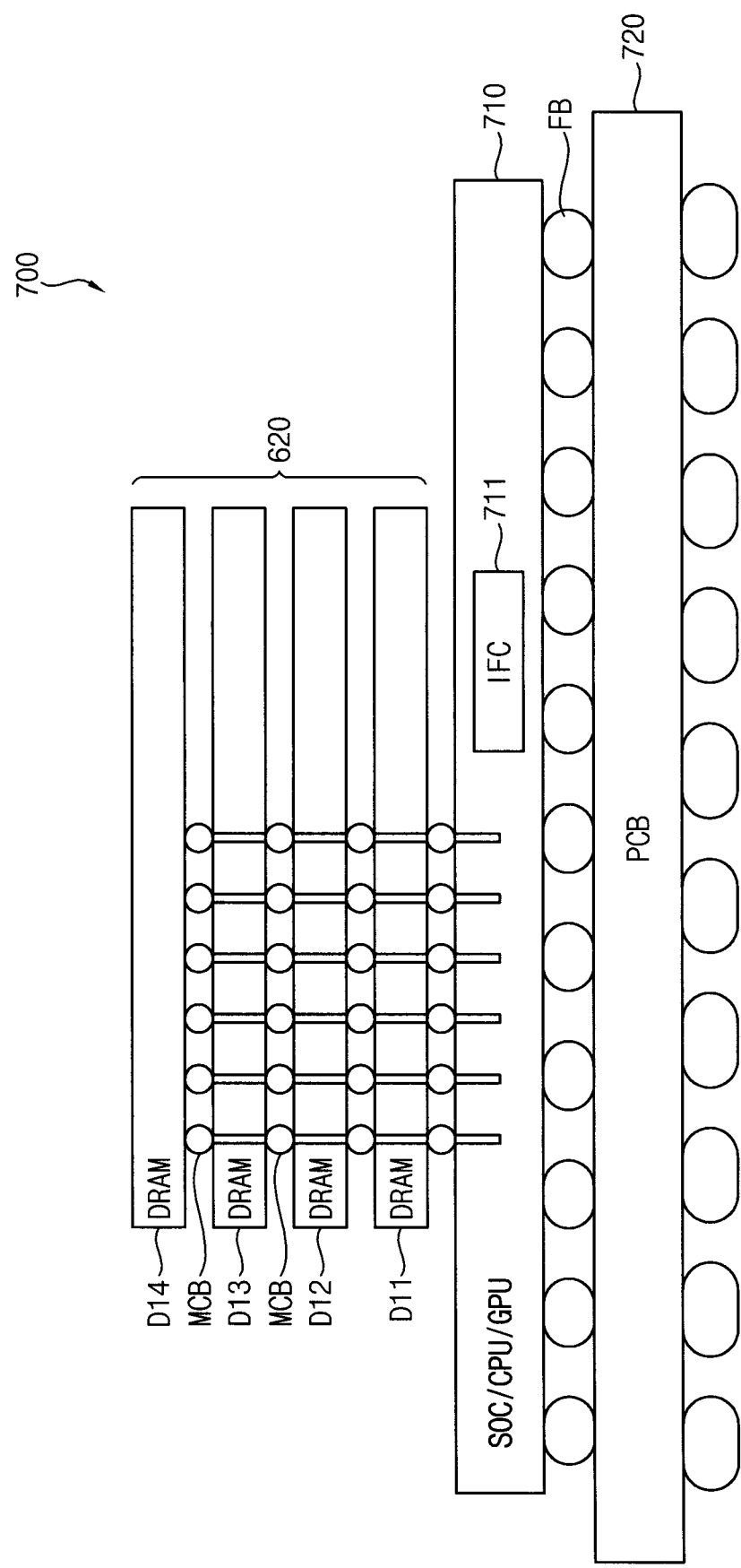
FIG. 19 is a cross-sectional view of a 3D chip structure employing the semiconductor memory device of FIG. 18 according to exemplary embodiments.

FIG. 19 is a cross-sectional view of a 3D chip structure employing the semiconductor memory device of FIG. 18 according to exemplary embodiments.

FIG. 19 shows a 3D chip structure 700 in which a host and a HBM are directly connected without an interposer layer.

Referring to FIG. 19, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 710 to implement a HBM structure such as the memory dies 620 in FIG. 18. In FIG. 19, the buffer die 611 or a logic die in FIG. 18 is omitted. However, the buffer die 611 or the logic die may be disposed between the memory die D11 and the host die 710. To implement the HBM, TSV lines may be formed at the memory dies D11 to D14. The TSV lines may be electrically connected with micro bumps MCB placed between memory dies D11 to D14. The host die 710 may include an interface circuit 711 including a second ECC engine.

Figure 20A:
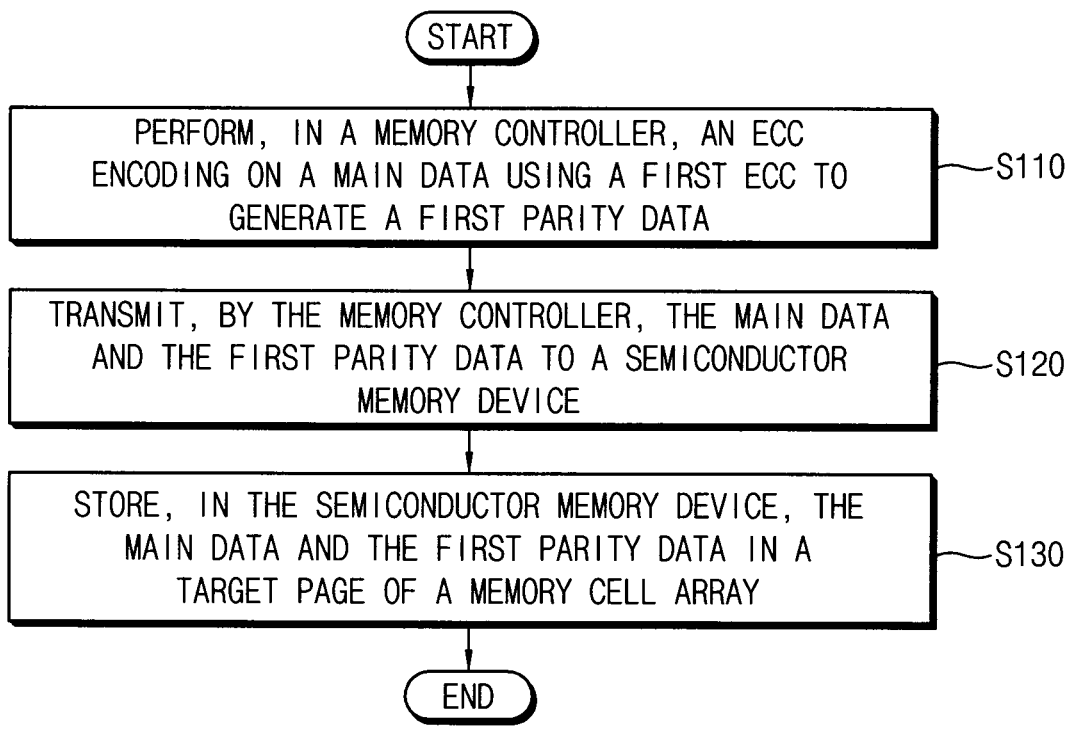
FIG. 20A is a flow chart illustrating a write operation of the memory system according to exemplary embodiments.

FIG. 20A is a flow chart illustrating a write operation of the memory system according to exemplary embodiments.

Referring to FIGS. 1 through 20A, there is provided a write operation of a memory system 10*a* that includes a memory controller 20 having a first ECC engine 30 and a semiconductor memory device (a stacked memory device) 70 communicating with the memory controller 20 and including a second ECC engine 500. The first ECC engine 30 in the memory controller 20 performs an ECC encoding on main data MD using a first ECC to generate a first parity data PRT1 (S110). The memory controller 20 transmits the main data MD and the first parity data PRT1 to the semiconductor memory device 70 (S120).

The semiconductor memory device 70 stores the main data MD and the first parity data PRT1 in a target page of a memory cell array (S130).

In an exemplary embodiment, the second ECC engine 500 performs an ECC encoding on the main data MD using a second ECC that has the same parity check matrix as the first ECC to generate the second parity data PRT2 and transmits an error flag EFL to the memory controller 20 based on a comparison of the first parity data PRT1 and the second parity data PRT2. The memory controller 20 may re-transmit the main data MD and the first parity data PRT1 to the semiconductor memory device 70 in response to the error flag EFL.

FIG. 20B is a flow chart illustrating a read operation of the memory system according to exemplary embodiments.

Referring to FIGS. 1 through 19 and 20B, an I/O gating circuit 390 reads the main data MD and the first parity data PRT1 from the target page of the memory cell array 400 based on the command CMD and the address ADDR from the memory controller 20 (S210), the main data MD and the first parity data PRT1 are provided to the second ECC engine 500. The second ECC engine 500 performs an ECC decoding on the main data MD and the first parity data PRT1 using a second ECC that has the same parity check matrix as the first ECC to correct a first type of error in the main data MD (S220).

The second ECC engine 500 transmits the first parity data PRT1 and the main data MD in which the first type of error is corrected to the memory controller along with a decoding status flag DSF (S230). The decoding status flag DSF may indicate a type of the corrected error.

The first ECC engine 30 in the memory controller 20 receives the main data MD and the first parity data PRT1 and performs an ECC decoding on the main data MD and the first parity data PRT1 using a first ECC to correct a second type of error in the main data MD (S240).

In an exemplary embodiment, the first type of error may correspond to a single bit error and the second type of error may correspond to a multi-bit error. In an exemplary embodiment, the first type of error may correspond to a multi-bit error, and the second type of error may correspond to a single bit error. In an exemplary embodiment, when the first type of error may correspond to a multi-bit error, and the second type of error may correspond to a transmission error.

Figure 21:
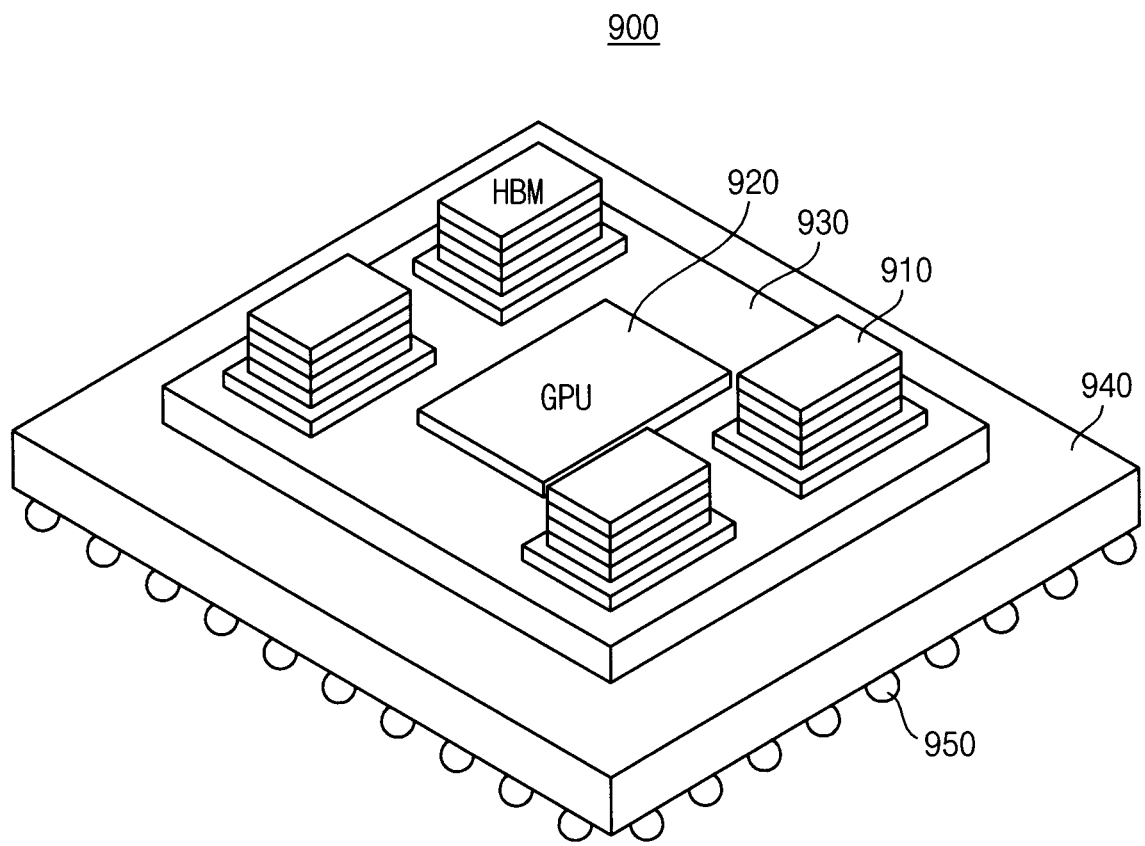
FIG. 21 is a diagram illustrating a semiconductor package including the stacked memory device according to exemplary embodiments.

FIG. 21 is a diagram illustrating a semiconductor package including the stacked memory device according to exemplary embodiments.

Referring to FIG. 21, a semiconductor package 900 may include one or more stacked memory devices 910 and a GPU 920.

According to an exemplary embodiment, The stacked memory devices 910 and the GPU 920 may be mounted on an interposer 930, and the interposer on which the stacked memory device 910 and the GPU 920 are mounted may be mounted on a package substrate 940.

The GPU 920 may perform same operation as the memory controller 20 in FIG. 2 or may be included in the memory controller 20. The GPU 920 may include a first ECC engine that uses a first ECC. The GPU 920 may store data, which is generated or used in graphic processing, in the stacked memory devices 910.

The stacked memory device 910 may be implemented in various forms, and the stacked memory device 910 may be a memory device in an high bandwidth memory (HBM) form in which a plurality of layers are stacked. Accordingly, the stacked memory device 910 may include a buffer die and a plurality of memory dies. The buffer die may include an interface circuit, and the interface circuit may include a second ECC engine using a second ECC that shares the same parity check matrix as the first ECC. Each of the memory dies includes a memory cell array and the memory cell array includes a normal cell region and a parity cell region. Therefore, the first ECC engine and the second ECC engine share the same parity check matrix because the first ECC engine and the second ECC engine share the same ECC, the first ECC engine and the second ECC engine 500 may generate the same parity data based on the same ECC and first ECC engine and the second ECC engine may correct different types of error in the ECC decoding using the same ECC.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

Here, the interposer 930 may include an embedded multi-die interconnect bridge (EMIB) which may be manufactured in an organic or non-TSV manner, or may have a TSV form or a printed circuit board (PCB) form.

At least one of the components, elements, modules or units (collectively "components" in this paragraph) represented by a block in the drawings, such as the ECC encoder 31 and the ECC decoder 33, may be embodied as various numbers of hardware, software and/or firmware structures that execute respective functions described above, according to an exemplary embodiment. For example, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Further, although a bus is not illustrated in the above block diagrams, communication between the components may be performed through the bus. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

Aspects of the disclosure may be applied to various systems that employ semiconductor memory devices and stacked memory devices to increase error correction capability.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the disclosure. Accordingly, all such modifications are intended to be included within the scope of the disclosure as defined in the claims.

What is claimed is:

1. A semiconductor memory device comprising:
a memory cell array including a plurality of volatile memory cells coupled to a plurality of word-lines and a plurality of bit-lines, the memory cell array including a normal cell region and a parity cell region; and
an interface circuit including an error correction code (ECC) engine, the interface circuit configured to:
in a write operation of the semiconductor memory device:
receive main data and first parity data from an external device having another ECC engine different from the ECC engine included in the interface circuit, the first parity data being generated based on a first ECC; and
store the main data in the normal cell region and the first parity data in the parity cell region,
in a read operation of the semiconductor memory device, perform an ECC decoding on the main data read from the normal cell region using a second ECC, based on the first parity data read from the parity cell region to correct a first type of error in the main data,
wherein the second ECC has a parity check matrix which is the same as a parity check matrix of the first ECC.

2. The semiconductor memory device of claim 1, wherein the interface circuit is configured to store the main data and the first parity data in a same page of the normal cell region and the parity cell region, respectively, connected to a same word-line, and
wherein the ECC engine is configured to correct an error in the first parity data by performing the ECC decoding.

3. The semiconductor memory device of claim 1, wherein the ECC engine, in the write operation, is configured to:
perform an ECC encoding on the main data using the second ECC to generate second parity data;
compare the first parity data and the second parity data;
transmit an error flag signal to the external device based on a result of the compare operation indicating that the first parity data does not match the second parity data; and
receive the main data and the first parity data again from the external device.

4. The semiconductor memory device of claim 1,
wherein the main data includes a plurality of symbols and each of the plurality of symbols includes a plurality of data bits,
wherein the second ECC includes a plurality of column vectors and the plurality of column vectors are divided into a plurality of code groups corresponding to the plurality of symbols,
wherein each of the plurality of code groups includes a first sub matrix and a second sub matrix, and
wherein each of the first sub matrices is same with respect to one another and each of the second sub matrices is different with respect to one another.

5. The semiconductor memory device of claim 4, wherein:
the main data includes $2^s$-bit of the data bits, wherein s is an integer equal to or greater than six;
the each of the symbols includes $2^{(s-3)}$-bit of the data bits;
the first parity data includes $2^s$-2-bit of parity bits; and
the second ECC is configured to correct single-bit error of the main data.

6. The semiconductor memory device of claim 4, wherein:
the main data includes $2^s$-bit of the data bits, wherein s is an integer equal to or greater than six;
the each of the symbols includes $^{(2s-3)}$-bit of the data bits;
the first parity data includes $2^{(s-2)}$-bit of parity bits; and
the second ECC is configured to correct multi-bit error of one of the symbols of the main data.

7. The semiconductor memory device of claim 1, further comprising:
a buffer die configured to communicate with the external device;
a plurality of memory dies stacked on the buffer die; and
a plurality of through silicon vias (TSVs) extending through the plurality of memory dies to connect to the buffer die, wherein each of plurality of memory dies includes the memory cell array, and wherein the buffer die includes the interface circuit and the interface circuit is configured to store the main data and the first parity data in one of the plurality of memory dies.

8. The semiconductor memory device of claim 7, wherein each of the memory dies further includes a cell core ECC engine, the cell core ECC engine including a third ECC and the third ECC having a parity check matrix which is the same as the parity check matrix of the second ECC.

9. The semiconductor memory device of claim 7, wherein the buffer die further comprises an internal command generator, wherein the internal command generator is configured to provide the interface circuit with a mode signal designating one of a plurality of operation modes, based on a command, wherein the interface circuit further comprises a selection signal generator configured to generate a selection signal based on the mode signal, and wherein the ECC engine is configured to correct a single bit error of the main data or correct multi-bit error of one of the symbols of the main data by performing the ECC decoding based on the mode signal.

10. The semiconductor memory device of claim 9, wherein the ECC engine comprises:

a memory configured to store the second ECC;

an ECC encoder connected to the memory and configured to perform an ECC encoding on the main data using the second ECC based on the mode signal to generate second parity data and configured to selectively generate an error flag signal based on a comparison of the first parity data and the second parity data; and an ECC decoder configured to perform the ECC decoding on the main data read from the normal cell region, based on the mode signal, wherein the ECC decoder is configured to:

correct the single bit error of the main data based on the mode signal designating a first mode of the read operation; and correct the multi-bit error of one of the symbols of the main data by performing the ECC decoding based on the mode signal designating a second mode of the read operation.

11. A memory system, comprising:

a memory controller including a first error correction code (ECC) engine, the memory controller configured to generate first parity data based on main data by using a first ECC; and a semiconductor memory device configured to receive the main data and the first parity data from the memory controller external to the semiconductor memory device, wherein the semiconductor memory device includes:

a memory cell array including a plurality of volatile memory cells coupled to a plurality of word-lines and a plurality of bit-lines, the memory cell array including a normal cell region and a parity cell region; and an interface circuit including a second ECC engine different from the first ECC engine, the interface circuit configured to:

in a write operation of the semiconductor memory device, store the main data in the normal cell region and the first parity data in the parity cell region, in a read operation of the semiconductor memory device, perform an ECC decoding on the main data read from the normal cell region using a second ECC, based on the first parity data read from the parity cell region to correct a first type of error in the main data, wherein the second ECC has a parity check matrix which is the same as a parity check matrix of the first ECC, wherein the first ECC engine is configured to receive the main data from the semiconductor memory device and is configured to correct a second type of error in the main data using the first ECC, and wherein the second type is different from the first type.

12. The memory system of claim 11, wherein the second ECC engine, in the write operation, is configured to:

perform an ECC encoding on the main data using the second ECC to generate second parity data;

compare the first parity data and the second parity data; and transmit an error flag signal to the memory controller based on a result of the comparison indicating that the first parity data does not match the second parity data.

13. The memory system of claim 11, wherein the main data includes a plurality of symbols and each of the plurality of symbols includes a plurality of data bits, wherein the second ECC represented as a generation matrix, includes a plurality of column vectors and the plurality of column vectors are divided into a plurality of code groups corresponding to the plurality of symbols, wherein each of the plurality of code groups includes a first sub matrix and a second sub matrix, and wherein each of the first sub matrices is same with respect to one another and each of the second sub matrices is different with respect to one another.

14. The memory system of claim 13, wherein, in the read operation, the second ECC engine is configured correct a single bit error of the main data using the second ECC, and the first ECC engine is configured to receive the corrected main data from the semiconductor memory device and is configured to correct a multi-bit error of one of the symbols of the corrected main data using the first ECC.

15. The memory system of claim 13, wherein, in the read operation, the second ECC engine is configured correct a multi-bit error of one of the symbols of the main data using the second ECC, and the first ECC engine is configured to receive the corrected main data from the semiconductor memory device and is configured to correct a single bit error of the corrected main data using the first ECC.

16. The memory system of claim 13, wherein, in the read operation, the second ECC engine is configured to:

correct a multi-bit error of one of the symbols of the main data using the second ECC, and a single bit error of the main data using the second ECC, the first ECC engine is configured to:

receive the corrected main data from the semiconductor memory device and correct a transmission error in one of the symbols of the corrected main data using the first ECC, wherein the transmission error corresponds to an error which is generated while the corrected main data is transmitted to the memory controller from the semiconductor memory device.

17. The memory system of claim 11, wherein:
the second ECC engine is configured to transmit, to the memory controller, a decoding status flag indicating the corrected first type of error; and
the first ECC engine is configured to correct the second type of error based on the decoding status flag.

18. The memory system of claim 11, wherein the semiconductor memory device further includes:
a buffer die configured to communicate with an external device;
a plurality of memory dies stacked on the buffer die; and
a plurality of through silicon vias (TSVs) extending through the plurality of memory dies to connect to the buffer die,
wherein each of plurality of memory dies includes the memory cell array, and
wherein the buffer die includes the interface circuit and the interface circuit is configured to store the main data and the first parity data in one of the plurality of memory dies.

19. A memory system, comprising:
a memory controller including a first error correction code (ECC) engine and a central processing unit (CPU) configured to control the first ECC engine, wherein the first ECC engine is configured to generate first parity data using main data and a first ECC; and
a semiconductor memory device configured to receive the main data and the first parity data from the memory controller external to the semiconductor memory device, wherein the semiconductor memory device includes:
a memory cell array including a plurality of volatile memory cells coupled to a plurality of word-lines and a plurality of bit-lines, the memory cell array including a normal cell region and a parity cell region; and
an interface circuit including a second ECC engine different from the first ECC engine, the interface circuit configured to:
in a write operation of the semiconductor memory device, store the main data in the normal cell region and the first parity data in the parity cell region,
in a read operation of the semiconductor memory device perform an ECC decoding on the main data read from the normal cell region using a second ECC, based on the first parity data read from the parity cell region to correct a first type of error in the main data,
wherein the second ECC has a parity check matrix which is the same as a parity check matrix of the first ECC.

20. The memory system of claim 19,
wherein the second ECC engine is configured to correct the first type of error in the main data by performing the ECC decoding and is configured to generate a decoding status flag indicating the corrected first type of error, and
wherein the first ECC engine is configured to receive the main data and the decoding status flag from the semiconductor memory device and is configured to correct a second type of error in the main data using the first ECC, and the second type is different from the first type.

* * * * *